(12) United States Patent
Weaver et al.

(10) Patent No.: US 8,957,579 B2
(45) Date of Patent: Feb. 17, 2015

(54) LOW IMAGE STICKING OLED DISPLAY

(75) Inventors: Michael Stuart Weaver, Princeton, NJ (US); Michael Hack, Princeton, NJ (US); Julia J. Brown, Yardley, PA (US); Mauro Premutico, Brooklyn, NY (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/618,423

(22) Filed: Sep. 14, 2012

(65) Prior Publication Data

US 2014/0077688 A1    Mar. 20, 2014

(51) Int. Cl.
*H01J 1/62* (2006.01)
*H01J 63/04* (2006.01)

(52) U.S. Cl.
USPC .............................. 313/504; 313/506; 313/512

(58) Field of Classification Search
USPC ......................................... 313/504, 506, 512
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,366,025 B1 | 4/2002 | Yamada |
| 6,468,819 B1 | 10/2002 | Kim et al. |
| 6,747,618 B2 | 6/2004 | Arnold et al. |
| 6,771,028 B1 | 8/2004 | Winters et al. |
| 6,895,667 B2 | 5/2005 | Forrest et al. |
| 7,091,986 B2 | 8/2006 | Phan |
| 7,198,832 B2 | 4/2007 | Burrows |
| 7,215,347 B2 | 5/2007 | Phan |
| 7,279,704 B2 | 10/2007 | Walters et al. |

(Continued)

FOREIGN PATENT DOCUMENTS

| | | |
|---|---|---|
| JP | 2007122033 | 5/2007 |
| JP | 2007123065 | 5/2007 |

(Continued)

OTHER PUBLICATIONS

Arnold, A.D. et al., "Full-Color AMOLED wih RGBW Pixel Pattern", Asia Display, IMID 04 Digest, pp. 808-811, 2004.

(Continued)

*Primary Examiner* — Thomas A Hollweg
(74) *Attorney, Agent, or Firm* — Morris & Kamlay LLP

(57) ABSTRACT

Devices and fabrication methods thereof are provided which reduce image sticking and/or improve lifetime and performance of blue emissive devices. Each device may include non-common transport layers between emissive devices, one or more optical capping layers, light and deep blue emissive devices, a mixed host emissive layer, a high T1 transport layer, and/or a stacked blue device in conjunction with single emissive layer red and/or green devices. The provided structures may be used individually, in combination, or as a group in a single device.

29 Claims, 14 Drawing Sheets

(56) References Cited

U.S. PATENT DOCUMENTS

| | | | |
|---|---|---|---|
| 7,431,968 | B1 | 10/2008 | Shtein et al. |
| 7,727,601 | B2 | 6/2010 | Burrows |
| 7,791,565 | B2 | 9/2010 | Fish et al. |
| 7,964,439 | B2 | 6/2011 | Kim et al. |
| 7,968,146 | B2 | 6/2011 | Wagner et al. |
| 2002/0186214 | A1 | 12/2002 | Siwinski |
| 2003/0042848 | A1 | 3/2003 | Park et al. |
| 2003/0230980 | A1 | 12/2003 | Forrest et al. |
| 2004/0032205 | A1 | 2/2004 | Hack et al. |
| 2004/0113875 | A1 | 6/2004 | Miller et al. |
| 2004/0174116 | A1 | 9/2004 | Lu et al. |
| 2004/0201558 | A1 | 10/2004 | Arnold et al. |
| 2005/0258433 | A1 | 11/2005 | Djurovich et al. |
| 2006/0231842 | A1 | 10/2006 | Hirakata et al. |
| 2007/0001584 | A1 | 1/2007 | Lee et al. |
| 2007/0015429 | A1 | 1/2007 | Maeda et al. |
| 2007/0164664 | A1 | 7/2007 | Ludwicki et al. |
| 2007/0236135 | A1 | 10/2007 | Fukuda et al. |
| 2007/0247061 | A1 | 10/2007 | Adamovich et al. |
| 2008/0224968 | A1 | 9/2008 | Kashiwabara |
| 2009/0261715 | A1 | 10/2009 | Sung et al. |
| 2010/0013378 | A1 | 1/2010 | Andrade |
| 2010/0090620 | A1 | 4/2010 | Hack et al. |
| 2010/0225252 | A1 | 9/2010 | Weaver et al. |
| 2011/0248294 | A1 | 10/2011 | Weaver et al. |

FOREIGN PATENT DOCUMENTS

| | | |
|---|---|---|
| WO | WO2007124172 | 11/2007 |
| WO | 2008057394 | 5/2008 |
| WO | 2010000976 | 1/2010 |
| WO | 2010011390 | 1/2010 |
| WO | 2010039938 | 4/2010 |

OTHER PUBLICATIONS

Baldo et al., "Highly efficient phosphorescent emission from organic electroluminescent devices", Nature, vol. 395, pp. 151-154, 1998.

Baldo et al., "Very high-efficiency green organic light-emitting devices based on electrophosphorescence", Applied Physics Letters, vol. 75, No. 1, pp. 4-6, Jul. 5, 1999.

Dandrade, Brian et al., "Blue Phosphorescent Organic Light Emitting Device Stability Analysis", UDC, Society for Information Display Digest of Technical Papers 34, 2, pp. 712-715, 2008.

Funahashi, Masakazu et al., "Highly efficient fluorescent deep blue dopant for Super Top Emission Device", Society for Information Display Digest of Technical Papers 47, 3, pp. 709-711, 2008.

Idemitsu Kosan Global ,, "Performance Chart of idel", available at http://www.idemitsu.com/products/electronic/el/performance.html (last visited Sep. 14, 2012).

Lee, Baek-Woon et al., "Late-News Paper: TFT-LCD with RGBW Color System", SID 03 Digest, pp. 1212-1215, 2003.

Lee, Baek-Woon et al., "Micro-cavity Design of RGBW AMOLED for 100% Color Gamut", Society for Information Display Digest of Technical Papers 68, 4, pp. 1050-1053, 2008.

Lee, Jinn-Haw et al., "High-Efficienct Fluorescent Blue Organic Light-Emitting Device with Balanced Carrier Transport", Journal of the Electrochemical Society, 157 (7), J226-28, 2007.

Peng, Du-Zen et al., "Challenges for Small- and Medium-Sized AMOLED Displays", Information Display 23, 2, pp. 12-18, 2007.

So, Franky ,, "Organic Electronics: Materials, Processing, Devices and Applications", CRC Press, Taylor & Francis Group, Boca Raton FL, pp. 448-449, 2010.

So, Woo-Young et al., "Power Efficient AMOLED Display with Novel Four Sub-Pixel Architecture and Driving Scheme", SID Symposium Digest of Technical Papers, vol. 41, issue 1, pp. 622-625, May 2010.

So, W-Y et al., "Power efficient AMOLED display with novel four sub-pixel architecture and driving scheme", Presentation, see SID Symposium Digest of Technical Papers, vol. 41, issue 1, pp. 622-625, May 2010.

Spindler, Jeffrey et al., "Lifetime- and Power-Enhanced RGBW Displays Based on White OLEDs", SID 05 Digest, pp. 36-39, 2005.

Weaver, M.S. et al., "Phosphorescent OLEDs for Displays and Lighting", UDC, Proceedings of the International Display Manufacturing Conference, pp. 328-333, 2008.

Hirano, et al., Novel Laser Transfer Technology fur Manufacturing Large-Sized Displays, Proceedings of the Society for Information Display, Digest of Technical Papers 38:(suppl2), Long Beach, 2007, pp. 1592-1595.

Lee, et al., "A New Patterning Method for Full-Color Polymer Light-Emitting Devices: Laser Induced Thermal Imaging (LITI)", Proceedings of the Society for Information Display, Digest of Technical Papers 33:(suppl2):784-787, 2002.

Lee, et al., "A Novel Patterning Method for Full-Color Organic Light-Emitting Devices: Laser Induced Thermal Imaging (LITI)", Proceedings of the Society for Information Display, Digest of Technical Papers 35:(suppl2):1006-1011, 2004.

Riel, et al., "Phosphorescent Top-Emitting Organic Light-Emitting Devices With Improved Light Outcoupling", Applied Physics Letters, 25 vol. 82, No. 3 (Jan. 20, 2003).

Riel, et al., "Tuning the Emission Characteristics of Top-Emitting Organic Light-Emitting Devices by Means of a Dielectric Capping Layer: An Experimental and Theoretical Study", Journal of Applied Physics, vol. 94, No. 8 (Oct. 15, 2003).

LOW IMAGE STICKING OLED DISPLAY

The claimed invention was made by, on behalf of and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices and, more specifically, to OLEDs with improved performance, especially with regard to the degree of image sticking exhibited by the device.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

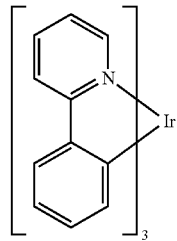

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, the term "capping layer" may refer to a layer of material that is deposited over the top electrode of an OLED (which is typically the cathode for top emission devices). The layer is typically used to enhance the amount of light outcoupled from the OLED. The layer may be made of any suitable material (such as $Alq_3$ and is preferably transparent, semi-transparent, or translucent. The term "total capping layer" may refer to the combination of all of the capping layers disposed over (and optically coupled to) an OLED. For instance, if a first and second capping layer are disposed over an OLED such that they are all optically coupled, the total capping layer of the OLED is the combination of the first and second capping layers. The "total optical thickness" is the optical thickness of the total capping layer.

As used herein, the term "optically coupled" may refer to a configuration in which substantially all of the light that is emitted from, or that propagates through, a surface of a first component also propagates through a substantially parallel surface of a second component. A "component" may include an organic device (e.g. OLED, transparent OLED, or top-emission OLED), a layer of an organic device (such as an organic layer, an emitting layer, etc.), a capping layer (which may be disposed over an organic device), a substrate, and/or an electrode of an organic device. For example, an OLED may be optically coupled to a capping layer if substantially all of the light that is emitted from the OLED in a direction perpendicular to one of its electrodes also propagates through a surface of a capping layer that is substantially parallel to the electrode.

As used herein, the term "deposit" or "depositing" includes any known method of fabricating a layer of an organic device on a first substrate, including VTE, OVJP, OVJD, stamping, ink jet deposition, LITI, LIPS, as well as fabrication (including photolithography) of a layer on a second substrate followed by alignment of the first and second substrates. Stamping (both additive (i.e. cold welding) and subtractive) is described in detail in U.S. Pat. Nos. 6,294,398, 6,895,667 and 7,964,439 each of which is hereby incorporated by reference.

As used herein, a capping layer or other layer may be "common" to a plurality of organic devices if it is disposed over (e.g. covering) a substantial portion of each of the plurality of OLEDs. For instance, if a capping layer is common to a first and a second OLED, but is not common to a third OLED, then the capping layer will be disposed over a substantial portion of both the first and second OLED, but will not be substantially disposed over the third OLED. Similarly, a layer may be referred to as "non-common" between or among a first and second OLED if the layer is disposed over a substantial portion of the first OLED, but no portion of the layer is disposed over a substantial portion of the second OLED, and if the non-common layer is disposed over none or only a trivial amount of the second OLED.

As used herein, the term "blanket layer" may refer to a layer that is common to all of, or substantially all of the OLEDs on a substrate. A blanket layer may be deposited through a mask that prevents material from depositing around the edges of the substrate (for example, in the area required for encapsulation or in areas requiring electrical contact from an external power supply or video signal). However, the deposition of a blanket layer generally does not involve deposition of materials onto the substrate through a mask that defines features on the substrate (such as individual pixels of one particular color), such as an FMM. In most cases, the mask used does not need to be aligned to a degree of precision that exactly matches the deposition holes with sub-pixel size features on the substrate.

As used herein a "patterned mask" or "fine metal mask" (FMM) may refer to masks that may be used to deposit materials onto a substrate. For VTE, usually the organic and metal layers are deposited through a "patterned mask" including blanket and/or common layers. Thus, the opening (i.e. "hole") in a "patterned mask" is usually large and covers a significant portion of the display or lighting panel area. In contrast, an FMM may be used to deposit features having a pattern resolution smaller than the entire active (light emitting) area of the substrate. Typically, an FMM has one dimension that is of the order of the dimensions of a portion of the sub-pixels (usually of one color) that is disposed on the substrate. An FMM is thereby typically utilized for the deposition of the emissive layer of an organic device, where the differing colors of the display are each deposited separately through an FMM designed to only allow deposition on a portion of the active OLEDs present in the display (e.g. an FMM through which only the red emissive layer is deposited, another FMM through which only the green emissive layer is deposited, etc.).

All masks whether "patterned" (such as those with a large opening for common deposition) or an FMM require some degree of alignment. However the FMM requires a far tighter alignment tolerance (e.g. on the order of the dimension of a portion of the sub-pixels) and thereby usually takes longer to align, which may add significantly to the time and cost of manufacturing. FMMs also typically require more regular maintenance (i.e. replacement or regular cleaning) than large area "patterned" masks, as the smaller "holes" in the FMM (through which material is deposited) can reduce in size as a function of deposition/production time as material is deposited onto them. This can cause problems in the display area as the deposition area of the FMM is reduced beyond its original design. Moreover, a build-up of material on an FMM can also cause issues related to "flaking" (i.e. material falling off the mask into the chamber or getting onto the substrate), which may create yield problems. These issues may not be as significant for a "patterned" large area mask, as the surface area of the mask onto which material can be deposited is far smaller (i.e. there are larger openings for material to be deposited through).

As used herein, the term "optical thickness" may refer to the product of the physical thickness of an isotropic optical element and its refractive index. The "physical thickness" of a capping layer or other layer refers to the length of the layer in a direction that is substantially perpendicular to the surface of the substrate that an OLED is disposed over.

As used herein, the term "optimized" or "optimal" may refer to maximizing the lifetime or efficiency of an OLED, which may result from reducing the loss of efficiency to less than approximately 5%.

More details on OLEDs, and the definitions described above, can be found in U.S. Pat. No. 7,279,704, which is incorporated herein by reference in its entirety.

SUMMARY OF THE INVENTION

Devices and techniques are provided to improve the performance of organic light emitting devices and, more specifically, to reduce the degree of image sticking by improving the performance of blue sub-pixels within the device.

An organic light emitting display is provided that is capable of being driven at about 500 $cd/m^2$ with a luminance decay of not more than about 3% after 20,000 hours of operation. The display may include one, some, or all of the other features disclosed herein, including OLEDs having non-common transport layers, one or more capping layers, sub-pixel arrangements including red, green, deep blue, and light blue sub-pixels, mixed-host emissive layers, combinations of multi-emissive layer and single emissive layer sub-pixels, or any combination thereof.

A device is provided that includes a first organic light emitting device (OLED) having a first peak emission wavelength and including a first transport layer, and a second OLED having a second peak emission wavelength different from the first peak emission wavelength and having a second transport layer. The first transport layer is a non-common layer among the first and second OLEDs, and the second transport layer is a non-common layer among the first and second OLEDs.

A device is provided that includes a plurality of OLEDs, each having an electroluminescent material. A first capping layer is disposed over a first portion of the plurality of OLEDs and optically coupled to the first portion of the plurality of OLEDs, and a second capping layer is disposed over a second portion of the plurality of OLEDs and optically coupled to the second portion of the plurality of OLEDs, but not optically coupled to the first plurality of OLEDs.

A device is provided that includes a first OLED having a red peak emission wavelength, a second OLED having a green peak emission wavelength, a third OLED having a light blue peak emission wavelength, and a fourth OLED having a deep blue peak emission wavelength. In an embodiment, the difference in peak wavelengths emitted by the third OLED and the fourth OLED is at least 4 nm.

A device is provided that includes an emissive layer comprising a first host material, a second host material, and an emissive material, where the HOMO of the second host material is between the HOMO of the first host material and the HOMO of the emissive material, and the LUMO of the second host material is between the LUMO of the first host material and the LUMO of the emissive material.

A device is provided that includes an emissive layer including an emissive material and a transport layer disposed adjacent to the emissive layer. The transport layer includes a material having a first triplet state having a higher energy level than a first triplet state of the emissive material.

A device is provided that includes a blue OLED having a blue peak emission wavelength and including a plurality of emissive layers, and a non-blue OLED having a single emissive layer.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
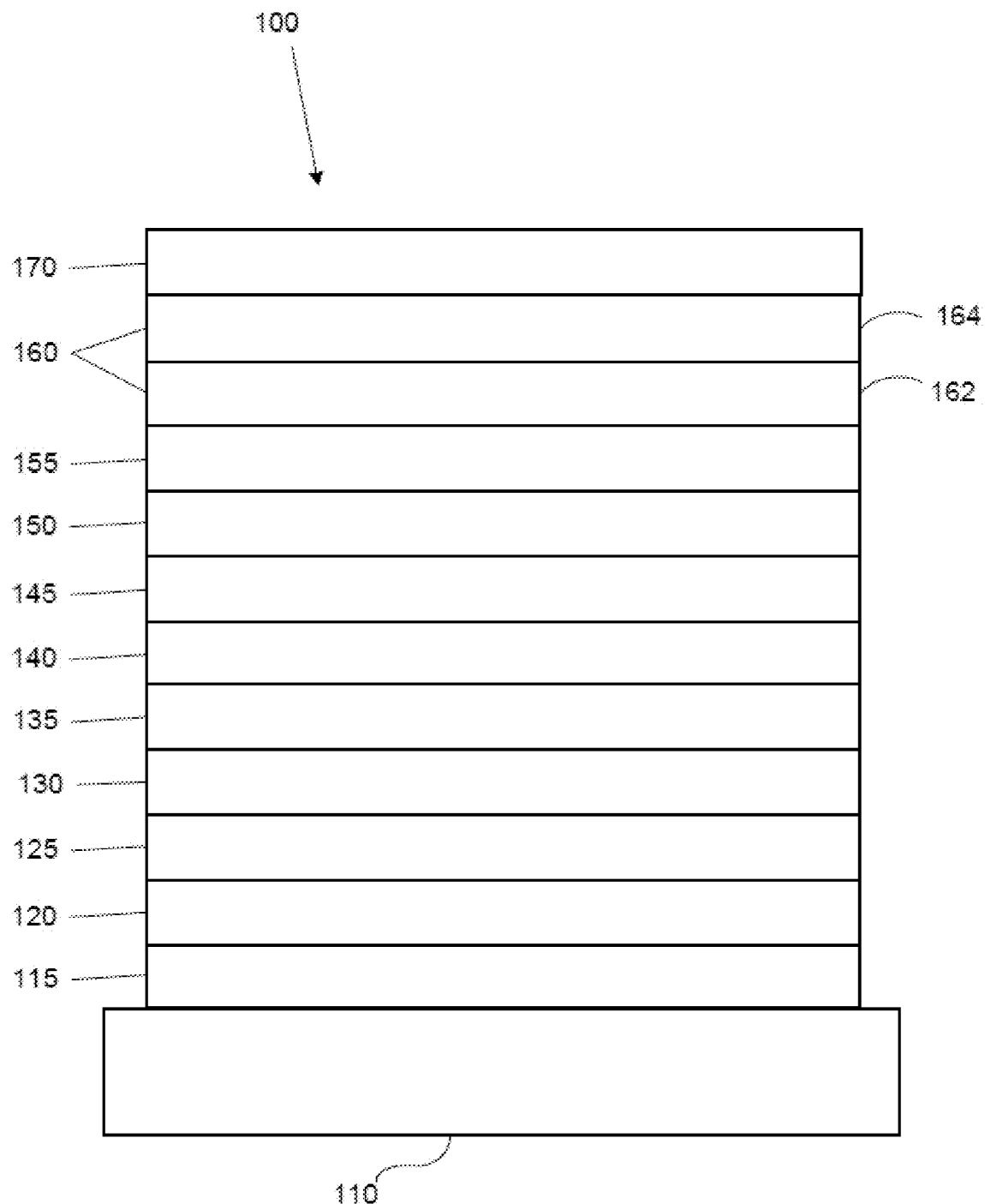
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_{4}$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
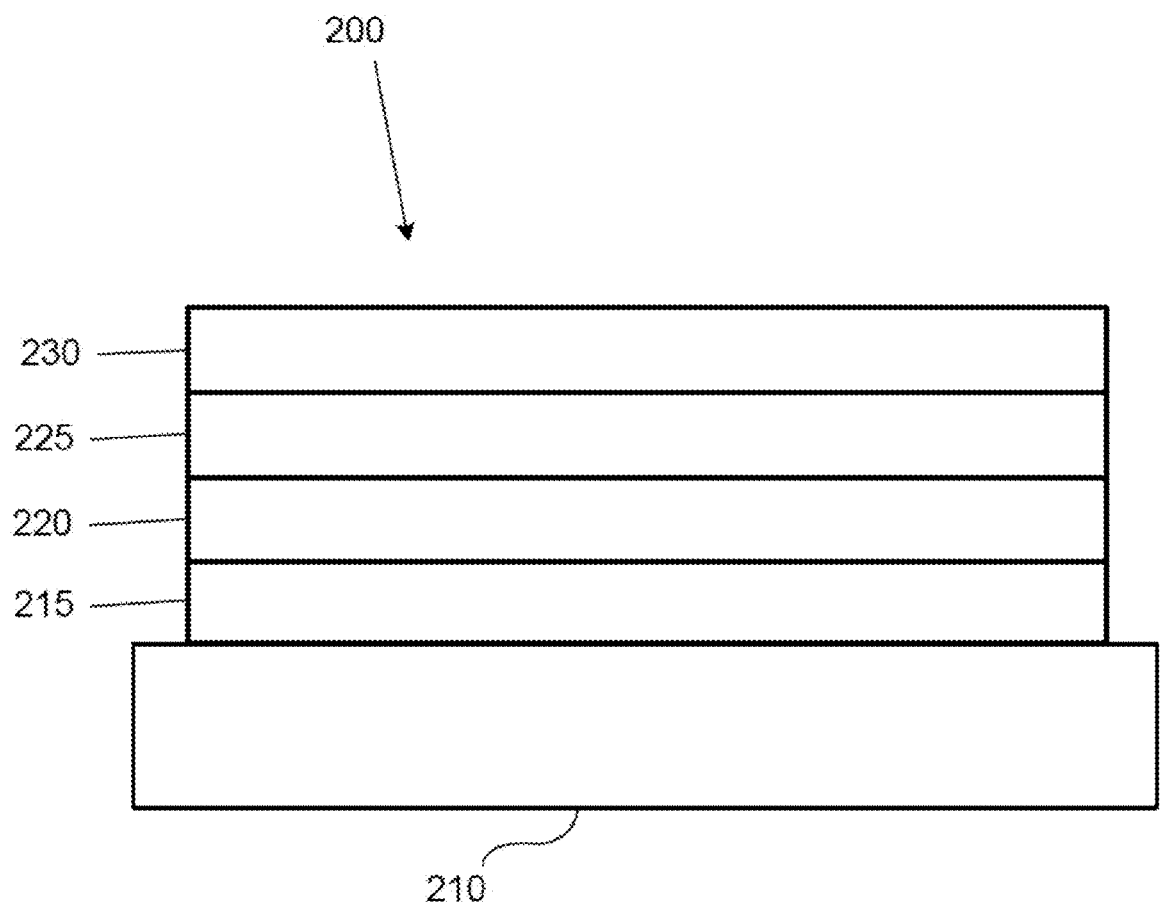
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Many OLED displays may suffer from image sticking and other undesirable effects, typically due to the lifetime of the blue devices limiting the overall display lifetime. It has been found that several components, techniques, and enhancements may provide enhanced lifetimes to blue devices, especially when used in combinations. As disclosed herein, the performance and lifetime of blue sub-pixels in an OLED, such as a side-by-side color display, may be improved by using one or more techniques during fabrication of the device. In some cases, these techniques and configurations may improve performance of the device such that an OLED display may be driven at 500 cd/m$^2$, and/or may exhibit a luminance decay of less than 3% at 20,000 hours of operation or more. As used herein, the level at which an OLED display is driven, such as 500 cd/m$^2$, is defined at the luminance of the display when showing a completely white image with all pixels on, where a "white" color or image refers to the target white balance point of the display. To assess the extent of decay of a display configuration, a new display can be driven to address only the red sub-pixels at a luminance required to produce a 500 cd/m$^2$ white image. The resulting luminance is then measured, and the same measurement performed for the green and blue sub-pixels. The display is then addressed or aged to show a white image at an initial luminance of 500 cd/m$^2$ for 20,000 hours. After 20,000 hours, the average luminance of the red, green, and blue sub-pixels is measured under the same image-addressing conditions that were used in the initial measurements to determine the extent of decay exhibited by each sub-pixel color. If all three colors after 20,000 hour ageing exhibit 97% or more of their initial luminance, then the display is considered to have an LT97 lifetime exceeding 20,000 hours.

Conventional blue or deep blue sub-pixel lifetime in an OLED display is typically around 650 hours to LT97 in a full color OLED display operating at 500 nits white. For example, in an illustrative device, the estimated LT50 lifetime of a device having 1931 CIE coordinates of (0.14, 0.14), with a luminous efficiency of 0.12 cd/A, is approximately 11,000 hrs at 1000 nits, as reported by Idemitsu Kosan Co., Ltd. at http://www.idemitsu.com/products/electronic/el/performance.html. Such a device may be estimated to have an LT97 lifetime of about 275 hours at 1000 nits, or about 650 hours at 620 nits, presuming an LT97/LT50 ratio of 0.05 and acceleration factor of 1.8. This, then, represents the desired luminance of a blue sub-pixel in such a display operating at a 500 nits white point.

The use of a luminance of 620 nits luminance for blue is derived from the following:

| | |
|---|---|
| Polarizer Efficiency | 44% |
| Green component = | 60% |
| Red component = | 30% |
| Blue component = | 10% |
| % pixel on | 40% |
| Display Width | 64.9653377 cm |
| Display Height | 48.8461186 cm |
| Display Brightness | 500 cd/m$^2$ |
| Sub-pixel FF | 55% |

It has been found that using one or more techniques as disclosed herein, improvement of up to a factor of 30-35 in blue sub-pixel lifetime may be achieved, resulting in a LT97 blue lifetime of 21,000 hours or more.

Conventional OLEDs typically use common-thickness transport layers for each color, typically to improve the manufacturing efficiency at the expense of performance. As disclosed herein, a technique for improving sub-pixel performance and/or lifetime is provided in which non-common transport layers in the OLED stack specific to each color may be used. The use of non-common transport layers for each separate color may improve the light output of each sub-pixel.

For example, by using non-common layer sub-pixels, red and green sub-pixel devices may have a higher efficiency than when common transport layers are used. In some configurations, improvements of up to about 10% and 40% may be achieved for the red and green sub-pixels, respectively, by allowing for smaller sub-pixel fill-factors while achieving the same light output. Further, this may provide a larger area for the blue sub-pixel. This may result in a higher lifetime for the blue sub-pixel and, therefore, the device as a whole, without negatively affecting the luminance of the device. In some configurations, the use of non-common layer sub-pixels may allow for an increase to the blue sub-pixel area by about 30%, which represents about a 50% increase in device lifetime.

Figure 14:
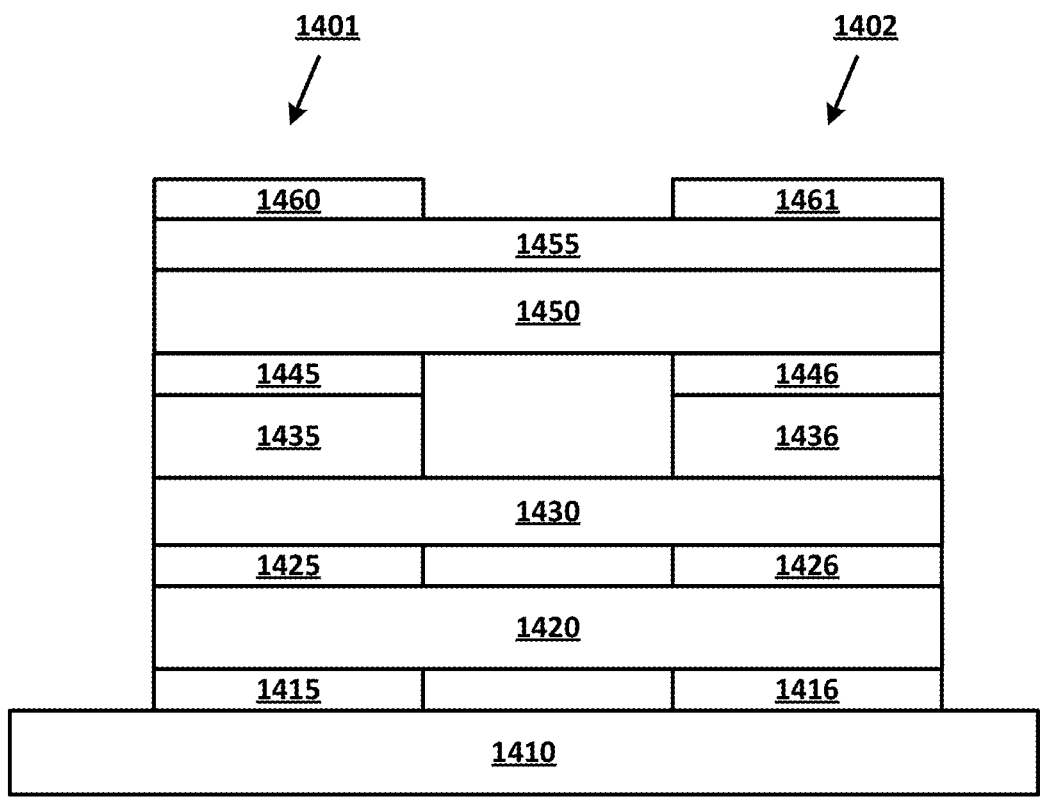
FIG. 14 shows an example arrangement of adjacent pixels with common and non-common layers as disclosed in an embodiment.

FIG. 14 shows adjacent sub-pixels having common and non-common layers as disclosed in an embodiment. Each sub-pixel 1401, 1402, may include any of the various layers disclosed herein, such as those described with respect to FIG. 1, though only a few layers are shown for illustration. A sub-pixel 1401 may include a substrate 1410, an anode 1415, a hole injection layer 1420, a hole transport layer 1425, an electron blocking layer 1430, an emissive layer 1435, an electron transport layer 1445, an electron injection layer 1450, a protective layer 1455, and a cathode 1460. A second sub-pixel 1402 may include a substrate 1410, an anode 1416, a hole injection layer 1420, a hole transport layer 1426, an electron blocking layer 1430, an emissive layer 1436, an electron transport layer 1446, an electron injection layer 1450, a protective layer 1455, and a cathode 1461. As shown, the two sub-pixel devices 1401, 1402 may have common layers 1420, 1430, 1450, 1455, and non-common layers 1415, 1416, 1425, 1426, 1435, 1436, 1445, 1446, 1460, 1461 as disclosed herein. More specifically, according to an embodiment, the sub-pixels may have one or more non-common transport layer 1425, 1445.

As previously described, conventional OLED arrangements often use one or more common transport layers among devices of different colors, and often optimize the content and configuration of the common transport layers for a specific color. In contrast, arrangements such as shown in FIG. 14 provide non-common transport layers, thus allowing the content and configuration of the transport layer to be tailored for each color. Additional examples of common and non-common layers are illustrated and described herein with respect to FIGS. 3-9. It will be understood that, although illustrated with respect to two adjacent sub-pixels, common layers may be disposed in more than two sub-pixels, and/or three or more sub-pixels or pixels may use non-common transport layers or other common and/or non-common layers, as disclosed herein.

Another technique that may improve the area of blue sub-pixels and device lifetime is the use of an optical capping layer. By adding one or more optical capping layers above the OLED cathode, the optical cavity of each sub-pixel may be optimized to increase pixel efficiency. As with the use of non-common transport layers, increasing the efficiency of the blue sub-pixel may improve lifetime at any given luminance, and improving the efficiency of the red and green sub-pixels in turn may allow more area for blue sub-pixel. The use of an optical capping layer may increase the area available for the blue sub-pixel by up to about 30%, which represents about a 50% increase in blue sub-pixel lifetime.

Typically in top emission (or transparent) organic devices, a capping layer is deposited onto the top electrode to enhance the emission from the device. That is, a capping layer (which typically includes high transparency materials) is employed to limit attenuation of the light emitted from a device. If the capping layer is chosen properly, the capping layer can enhance the output of a top-emitting device by, for instance, increasing the luminance by reducing the outcoupling losses from the device due to processes such as internal waveguiding. However, the optimal thickness (in terms of efficiency) of a capping layer made of a given material differs depending on the light emission color (and thereby the wavelength of the light). This is due to the difference in the wavelength of the different color light emissions and the corresponding effects of interference patterns (both wide angle and multiple beam interference) created in the OLEDs. The effect of the thickness of a capping layer on light transmission from a top-emitting OLED is described in detail in the following references, which are hereby incorporated in there entireties for all purposes:

H. Riel, S. Karg, T. Beierlein, B. Ruhstaller, and W. RieB, "Phosphorescent Top-Emitting Organic Light-Emitting Devices With Improved Light Outcoupling," Applied Physics Letters, 25 Vol. 82, No. 3 (Jan. 20, 2003).

H. Riel, S. Karg, T. Beierlein, B. Ruhstaller, and W. RieB, "Tuning the Emission Characteristics of Top-Emitting Organic Light-Emitting Devices By Means of a Dielectric Capping Layer: An Experimental and Theoretical Study," Journal of Applied Physics, Vol. 94, No. 8 (Oct. 15, 2003).

It has been recognized that one way to achieve maximum efficiency for a device comprising a plurality of OLEDs emitting light of different wavelengths is to have different capping layers for each of the organic devices. For example, for a side-by-side red-green-blue (RGB) display, embodiments provided herein may utilize different optical thicknesses of the capping layer for each of the RGB pixels (e.g. a first capping layer optical thickness disposed over the blue pixels, a second capping layer optical thickness disposed over the green pixels, and a third capping layer optical thickness disposed over the red pixels). In some embodiments, rather than or in addition to varying the physical thickness of the capping layer, different materials may be used for the different capping layers for each of the different colored OLEDs to achieve a similar optimization (which may thereby vary the optical thickness of the capping layer based on the index of refraction of the materials). Although described with respect to an RGB display, it should be understood that embodiments are not so limited, and may provide for different capping layer thicknesses (and/or materials) for each color OLED in any given device.

However, providing different capping layer physical thicknesses and/or materials for each of the OLED devices (i.e. for each of the colors emitted) can add to the cost and complexity of the manufacturing process for a device or apparatus (such as a display) that comprises multiple colored OLED devices. Moreover, additional manufacturing steps create more opportunities for errors in the manufacturing process to occur. Therefore, the solution developed by manufacturers typically compromises choosing a single thickness and material for a capping layer that is tailored to the 'weakest' color (usually blue). By 'weakest' color, what is meant is the color for which the OLEDs are least efficient or shortest lived. This use of only a single capping layer results in less than optimal performance for the OLEDs that emit light having a different wavelength than the one for which the capping layer thickness is optimized. Typically, this is the red and green organic devices when the capping layer is chosen to maximize the blue OLEDs. For instance, using a less than optimal capping layer (e.g. a capping layer optimized for blue light emissions) may result in a loss of approximately 5-10% in potential green efficiency and/or a loss of approximately 30% in potential for red efficiency. By 'potential efficiency,' it is meant the efficiency of a device if the capping layer is chosen to optimize its efficiency. Therefore, the device as whole does not operate as efficiently as possible.

Embodiments provided herein disclose devices (such as displays) that have the light emissions of each OLED optimized by utilizing a total capping layer for each organic device that has an optical thickness that is different for each color light emission (e.g. by providing different thicknesses and/or materials as needed). The effects of the interference patterns created in such top-emissions devices are dictated in part by the optical thickness of the capping layer and the wavelength of the light emissions and can thereby be minimized. Despite the understanding in the art that the thickness of the capping layer may effect the optical efficiency of OLEDs, there has been no recognition of this solution, which provides a novel approach for devices having a plurality of OLEDs emitting multiple colors (e.g. a red, green, and blue display). Indeed, within the industry such a solution is taught away from because of the notion that it would be impractical and/or not cost effective to manufacture such a device. However, provided herein are embodiments of devices and methods of manufacturing such embodiments that may satisfy some or all of these concerns.

As noted above, achieving optimization of light emission for each color OLED in a device by utilizing capping layers having different optical thicknesses could substantially increase the cost of manufacturing such devices using traditional processes. That is, providing different capping layer thicknesses or materials could require the use of multiple deposition processes or steps. For instance, using traditional approaches may require the use of multiple patterned masks (e.g. FMMs in combination with VTE deposition through the FMM) for depositing each of the different materials and/or different thicknesses of the same material over each OLED color. A typical RGB device (that is, a device comprising OLEDs having one of three different colors) would typically involve two additional fine deposition steps, each requiring the use of an FMM.

However, each time a process requires the use of an additional deposition step (particularly through an FMM), the costs in both time and expense of fabrication increases. For example, each iteration may require that a patterned mask (and in particular, an FMM) be properly aligned prior to depositing additional materials to a device. As noted above, FMMs often require a tight alignment tolerance and thereby usually take a relatively long time to align properly. Moreover, FMMs often have high costs associated with their continued use—typically requiring regular maintenance (i.e. replacement or regular cleaning) as the small "holes" in the mask can reduce in size as a function of deposition and/or production time as material is deposited onto the mask.

Furthermore, utilizing FMMs often increases the chances of certain defects occurring in the manufacturing process, such as issues related to the reduction of the area that is deposited through the mask (based on the increase of material deposited in the "holes" of the mask) thereby causing problems in the lighting or display area. A build up of material on an FMM can also cause issues due to "flaking"—i.e. material falling off the mask into the chamber or getting onto the substrate, which may induce yield problems. Therefore, the inventors have further recognized the preference of utilizing alternative deposition techniques to depositing multiple capping layers.

Embodiments provided herein allow for the use of a different capping layer optical thickness for each pixel and/or color OLED (thereby enabling optimization of the output efficiency of each of the OLEDs of a device), without requiring the additional steps of performing deposition using a FMM. In an exemplary embodiment, for instance, red, green, and blue OLEDs may be fabricated utilizing known techniques including a common capping layer (e.g. a capping layer that may be common to multiple pixels that are different colors). This capping layer may be designed so as to match (i.e. optimize) the blue pixel, as typically this pixel may also require the smallest thickness of material. The additional capping layer material needed to optimize the red and green pixels may then be deposited so as to be optically coupled with each pixel. However, application of the additional material may not be done using a FMM and/or VTE deposition of the material. Instead, embodiments provided herein may deposit the additional material using, for example, laser induced thermal imaging (LITI) and/or laser induced patternwise sublimation (LIPS) deposition onto the common capping layer.

In brief and in no way limiting, some examples of LITI processes utilize a donor film (donor), a highly accurate laser exposure system, and a substrate (receptor). The donor film may 20 first be laminated onto the substrate using any known method such that the donor and receptor are in intimate contact. The donor may comprise a light-to-heat conversion (LTHC) layer that converts laser energy to heat. The LTHC layer comprises material that absorbs the wavelength of irradiation and converts a portion of the incident radiation into sufficient heat to enable the transfer of a thermal transfer layer (typically organic materials) from the donor to the receptor. The donor is then exposed (in an imagewise pattern) with a laser beam from the highly accurate laser exposure system, which is absorbed by the LTHC layer. This results in the release of the thermal transfer layer from the donor, as well as the adhesion of the thermal transfer layer to the receptor. After the transfer of all the desired materials is complete, the donor is peeled away from the receptor interface. In this manner, only the exposed region of the donor transfers materials to the receptor. However, it should be understood that there may be other LITI processes that utilize similar method and principles, and this description is not meant to be limiting.

Further examples and details of LITI processes are described in the following references, each of which is incorporated by reference in their entireties and for all purposes:

S T Lee, J Y Lee, M H Kim, M C Suh, T M Kang, Y J Choi, J Y Park, J H Kwon, H K Chung, "A New Patterning Method for Full-Color Polymer Light-Emitting Devices: Laser Induced Thermal Imaging (LITI)," Proceedings of the Society for Information Display, Digest of Technical Papers 33:(suppl2), Boston, 2002, pp 784-787.

S T Lee, B D Chin, M H Kim, T M Kang, M W Song, J H Lee, H D Kim, H K Chung, M B Wolk, E Bellman, J P Baetzold, S Lamansky, V Sawateev, T R Hoffend, J S Staral, R R Roberts, Y Li. A novel patterning method for fill-color organic light-emitting devices: laser induced thermal imaging (LITI). Proceedings of the Society for Information Display, Digest of Technical Papers 35:(suppl2), Seattle, 2004, pp 1008-1011.

LIPS processes may be similar to LITI processes with the exception that the donor and receptor may first be put together in a vacuum and fixed with a clamping mechanism. The donor, receptor, and clamping mechanism are then removed from the vacuum (and are held together by atmospheric pressure applied to either substrate), while a gap between the pixels may be maintained by the height of a pixel defined layer (PDL). A laser is then used to heat the desired portions of the donor (e.g. glass substrate having donor materials) such that the donor materials are transferred to the receptor by vacuum sublimation. An example of a LIPS process is described in the following reference, which is incorporated by reference in its entirety and for all purposes:

T Hirano, K Matsuda, K Kohinata, K Hanawa, T Matsumi, E Matsuda, T Ishibashi, A Yoshida, T Sasaoka, "Novel Laser Transfer Technology for Manufacturing Large-Sized Displays, Proceedings of the Society for Information Display, Digest of Technical Papers 38:(suppl2), Long Beach, 2007, pp 1592-1595

LITI and LIPS processes have certain disadvantages that typically make them less then ideal, particularly for deposition of materials that have electro-active properties. For instance, in LITI processes, contact between the donor film and any emitting layer can degrade the device; the transferred layer interface is formed by a lamination process, which may also degrade a device; and the process may be highly sensitive to particle contamination, which may disrupt electrical contacts (although this may be reduced by the LIPS process by the creation of a vacuum between the donor and the substrate). Both deposition techniques also require the application of very high power density energy. Such application can cause thermal degradation of the materials or require additional constraints on the thermal properties of the materials being deposited (e.g. Tg, sublimation temperature range, etc.). These constraints limit the choice of material that can be used in the electro-active components.

However, unlike the deposition of the organic layers that LITI and LIPS processes have thus far been utilized to deposit, capping layer materials are not electrically active components in the OLED device. The inventors have recognized thereby that concerns and complications typically related to the LITI process and its deleterious effect from a lifetime perspective are reduced when using this process for depositing additional capping layer thicknesses and materials. Moreover, in some embodiments, the LITI process could also be potentially performed in a glove box or in air. Such a process would likely be far less costly than the FMM/VTE approach to depositing optimized capping layers for each OLED. For example, neither LITI nor LIPS requires the use of a mask, making it highly adaptable as there is no need for retooling if a design is changed. Moreover, the use of laser deposition techniques can be highly precise, and do not require the alignment of masks to deposit materials. Furthermore, and as discussed below, if the capping layer is not deposited by VTE through an FMM, then it can be done offline (i.e. separate from an in-line manufacturing process) and thereby simplify the manufacturing process. This is due in part because the materials would not be directly deposited onto the substrate that comprises the organic materials, which are often less tolerant to manufacturing and deposition conditions (such as heat).

For instance, in some embodiments, the capping layer or capping layers may not be deposited directly onto the organic devices. Instead, the capping layer material may be deposited onto a second substrate, such as a display cover glass. In some embodiments, for an RGB display, this may be the capping layer material for optimizing only red OLEDs. This patterning can be done using a variety of deposition methods including photolithography, LITI, LIPS, stamping, or inkjet printing as the capping layer is not an electrically active component in the device and therefore concerns over damage during deposition are lessened. Continuing with the RGB display example, the red capping layer material may be deposited in such a way as to enable it to be aligned with the corresponding red sub pixel pattern on the display backplane. When the cover glass and backplane are then mated (i.e. coupled) together the red capping layer would then be optically coupled to a common capping layer (which may in some embodiments be deposited as a blanket layer—e.g. not through an FMM) over the red sub pixels enabling the common capping layer and red capping layer to be optically coupled to the red sub pixels.

In general, because the blue pixel is the usual candidate for the optimized capping layer (i.e. when only a single uniform capping layer is provided), in some embodiments the red pixel is the color that usually is most disadvantaged in terms of efficiency. Therefore, in some embodiments, for the fabrication methods described above, the most important color (after blue) may be the red pixel from an optimization perspective. Therefore it may be possible to only apply the additional capping layer material to the red sub-pixels (assuming there is already a common capping layer—i.e. that the capping layer is common to a plurality of OLEDs that is designed to optimize the blue OLEDs) in order to simplify the fabrication process, while achieving an increase in performance of the device. Thus, in such embodiments, there may be only two different capping layers: a first capping layer that is common to all of the OLEDs (i.e. the red, blue, and green OLEDs) and a second capping layer that is optically coupled to only the red OLEDs. However, as described below, embodiments are not so limited and this is merely for illustration purposes.

Described below are exemplary embodiments of devices, and exemplary methods of manufacturing devices, comprising organic devices and different capping layers (i.e. non-common). The embodiments are described for illustration purposes only and are not thereby intended to be limiting. After reading this disclosure, it may be apparent to a person of ordinary skill that various components as described below may be combined or omitted in certain embodiments, while still practicing the principles described.

Moreover, it should be understood that while the discussion provided herein discloses various embodiments of devices, and methods of manufacturing such devices, that generally comprise a non-common capping layer (or layers) without requiring a specific manner in which the non-common capping layer (or layers) was deposited, it is generally preferred that the non-common capping layers are not deposited through an FMM. Such preferred deposition techniques may comprise utilizing other methods such as, for example, LIPS, LITI, or deposition onto a second substrate and alignment (as described below). Therefore, the disclosure below should be understood as describing various embodiments comprising capping layers disposed using any known method, but also as embodiments comprising the same features as those devices but preferably comprising a non-common capping layer (or layers) that are not deposited through the use of an FMM.

A method for fabricating an organic device having a non-common capping layer is provided. A first method comprises providing a plurality of OLEDs on a first substrate. "Providing" may comprise any known manner of obtaining a substrate having a desired number and type of organic devices disposed thereon. This includes, by way of example, depositing the OLEDs on the substrate using any known technique, including those described above. Moreover, embodiments also comprise purchasing or otherwise obtaining a substrate that already has some or all of the OLEDs (or components thereof) disposed thereon. In cases where only some of the components are provided on a substrate, it is also envisioned that "providing" encompasses completing the components (e.g. by depositing additional layers of materials) of the OLEDs on the substrate.

Each of the plurality of OLEDs includes a transmissive top electrode. That is, the top electrode may be transparent, semi-transparent, or translucent such that light may propagate through the top electrode. In some embodiments, the OLED may be a transparent OLED or a top-emission OLED. Top-emitting OLEDs are often better suited for active-matrix applications because, for instance, they may be more easily integrated with a non-transparent transistor backplane. This is often the case for displays.

The plurality of OLEDs includes a first portion of OLEDs and a second portion of OLEDs that is different from the first portion. That is, the OLEDs that comprise the first portion are separate and distinct from the OLEDs that comprise the second portion such that there is no overlap between these two designations. In some embodiments, the first portion may comprise only OLEDs that emit a single color. In some embodiments, the first portion and the second portion of OLEDs do not comprise any overlap in OLEDs that emit a single color. That is, for instance, a red OLED will not be included in both the first portion and the second portion of the plurality of OLEDs.

The first method further includes depositing a first capping layer over at least the first portion of the plurality of OLEDs such that the first capping layer is optically coupled to at least the first portion of the plurality of OLEDs. As described above, the capping layer is often used in top emission organic devices to decrease the absorption and interference loses created by the transparent conductor and the reflectivity of the bottom electrode. The capping layer may comprise any suitable material, and may comprise a dielectric material. In some embodiments, the capping layer is preferably $Alq_3$. The first capping layer may be deposited using any suitable method, including those described above.

The first method also comprises depositing a second capping layer over at least the second portion of the plurality of OLEDs such that the second capping layer is optically coupled to the second portion of the plurality of OLEDs but not the first portion of the plurality of OLEDs. That is, in some embodiments, the second capping layer is deposited so that it is disposed over the second portion of the plurality of OLEDs, but not the first portion so that the optical thickness of the total capping layer over the first portion and the second portion of the plurality of OLEDs may be different. As defined above, the total capping layer may refer to the combination of each of the capping layers disposed over an OLED—for instance, if the first and second capping layer are both optically coupled to the second portion of the plurality of OLEDs, then the total capping layer is the combination of the first and second capping layer. This is illustrated in the various embodiments shown in FIGS. 3 and 5-9, which are described below. Preferably, the second capping layer, as noted above, be deposited using a method that does not utilize an FMM, for the reasons noted. The first method and resulting device described above may provide advantages over current devices. For instance, by providing a first and a second capping layer, the device may optimize the emissions from at least two different color emitting OLEDs. For instance, current devices (such as displays comprising OLEDs) only utilize a single capping layer that is common across all of the organic devices, regardless of the wavelength of the light emission from each device. The result is that while the OLEDs that emit light having one color may be optimized, the other organic devices are not effectively out coupled so as to provide maximum efficiency. It should be noted that the effect of the optical thickness on different light emissions was described above, particularly in H. Riel, et al "Phosphorescent Top-Emitting Organic Light-Emitting Devices With Improved Light Outcoupling," and "Tuning the Emission Characteristics of Top Emitting Organic Light-Emitting Devices By Means of a Dielectric Capping Layer: An Experimental and Theoretical Study." Moreover, the effectiveness of having multiple capping layers that are optimized for the different wavelength emissions (i.e. having different optical thicknesses) is demonstrated below in the experimental simulations section.

In some embodiments, in the first method as described above in which a plurality of OLEDs are provided on a substrate and a first and second capping layer are deposited so as to be optically coupled to a first and second portion of the OLEDs, respectively, the second capping layer is not deposited through a patterned mask or, preferably, through an FMM. As was described above, additional deposition steps using FMMs may increase expense and time to manufacture organic devices. By utilizing alternative methods, as discussed below, embodiments may provide methods that are more cost effective, flexible, and time efficient. Furthermore, these alternative deposition methods have not been utilized in applying capping layers to top emission devices (let alone non-common capping layers having different optical thicknesses). The inventors have recognized that such techniques, while having limitations that may make them less than ideal when depositing electrically active components, do not present some or all of those deficiencies with regard to capping layers because the capping layers are not electrically active (they may comprise dielectric materials). In this regard, in some embodiments, the second capping layer is deposited using at least one of laser induced thermal imaging (LITI) or laser induced pattern-wise sublimation (LIPS). While these exemplary deposition techniques may require the application of very high power density energy and may thereby cause thermal degradation of the materials or require additional constraints on the thermal properties (as described above) making them not preferable for depositing electro-active components, these same deficiencies are reduced when applying non-electro-active layers. However, in some embodiments, any deposition technique that does not involve the use of an FMM or similar technique may be used.

In some embodiments, the first method as described above further includes depositing the first capping layer over at least the second portion of the plurality of OLEDs such that the first capping layer is optically coupled to the second portion of the plurality of 0 LEDs. This is illustrated in the exemplary embodiments shown in FIGS. 3 and 7-9. For instance, in some embodiments, the first capping layer may be optically coupled to OLEDs that emit light in different colors, whereas the second capping layer may be optically coupled to OLEDs that emit light of a single color. However, embodiments may not be so limited. In some embodiments, the first capping layer is optically coupled to at least one color of OLEDs that the second capping layer is not optically coupled to. For example, in some embodiments, the first capping layer may be optically coupled to a plurality of blue, green, and red OLEDs, whereas the second capping layer may be optically coupled to only a plurality of red or green (or both) OLEDs.

In this regard, in some embodiments, the first capping layer may comprise a blanket layer. That is, the first capping layer may be deposited so as to be disposed over all, or substantially all, of the OLEDs on a substrate of a device such that it is common to each of the OLEDs. This may have the advantage that the first capping layer need not be deposited through a FMM or other expensive and/or complex deposition process. The optical thickness of the first capping layer may be selected so as to optimize the OLEDs that emit light of a particular color. In some embodiments, the optical thickness of the first capping layer may be selected so as to correspond to the smallest thickness that optimizes at least one of the OLED emission colors. In this manner, additional capping layers may be disposed over the first capping layer so that the total capping layer that is optically coupled to OLEDs having a different color are also optimized (i.e. the optical thickness is optimized for light emissions having a particular wavelength).

Figure 4:
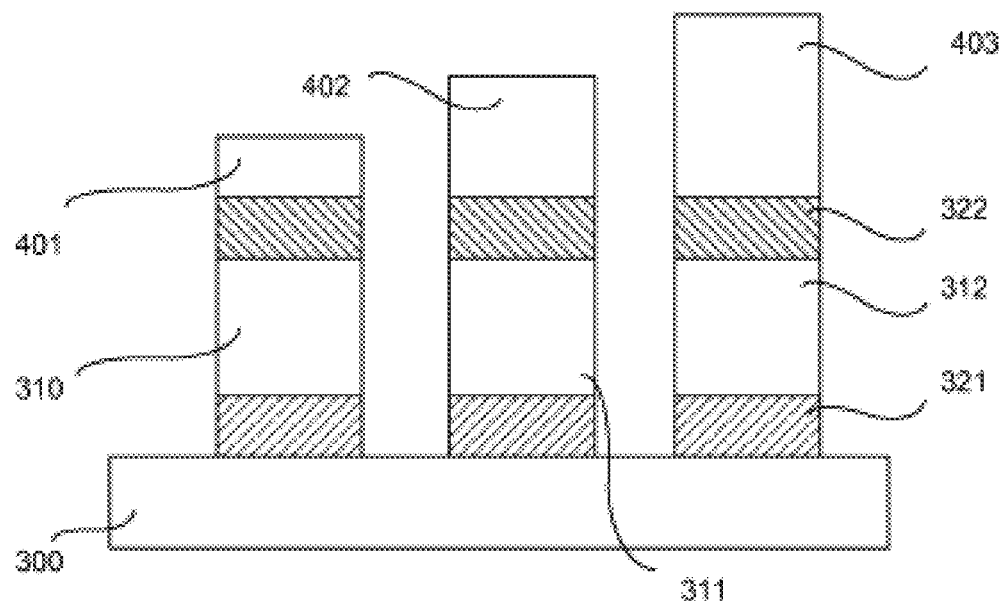
FIG. 4 shows a side view of an exemplary embodiment comprising a first capping layer, a second capping layer, and a third capping layer.

In some embodiments, the first capping layer is not deposited over the second portion of the plurality of OLEDs such that the first capping layer is not optically coupled to the second portion of the plurality of OLEDs. An exemplary embodiment of this is shown in FIG. 4, whereby none of the optical layers are common across OLEDs of different colors. In some embodiments, in the first method described above, the plurality of OLEDs are transparent OLEDs and/or are top emission OLEDs Again, top emission OLEDs may be better suited for certain implementations, such as displays.

In some embodiments, in the first method described above, the first capping layer has a first total optical path that is constant over the first portion of the plurality of 0 LEDs, the second capping layer may comprise a second total optical path that is constant over the second portion of the plurality of OLEDs, and the first total optical path and the second total optical path are different. This may be the case in some embodiments when the plurality of OLEDs comprise OLEDs that emit light of different wavelength, and thereby the optical thickness that maximizes the efficiencies of the OLEDs is also different. Thus, embodiments that provide two different optical thickness may be capable of maximizing two different color OLEDs.

Figure 8:
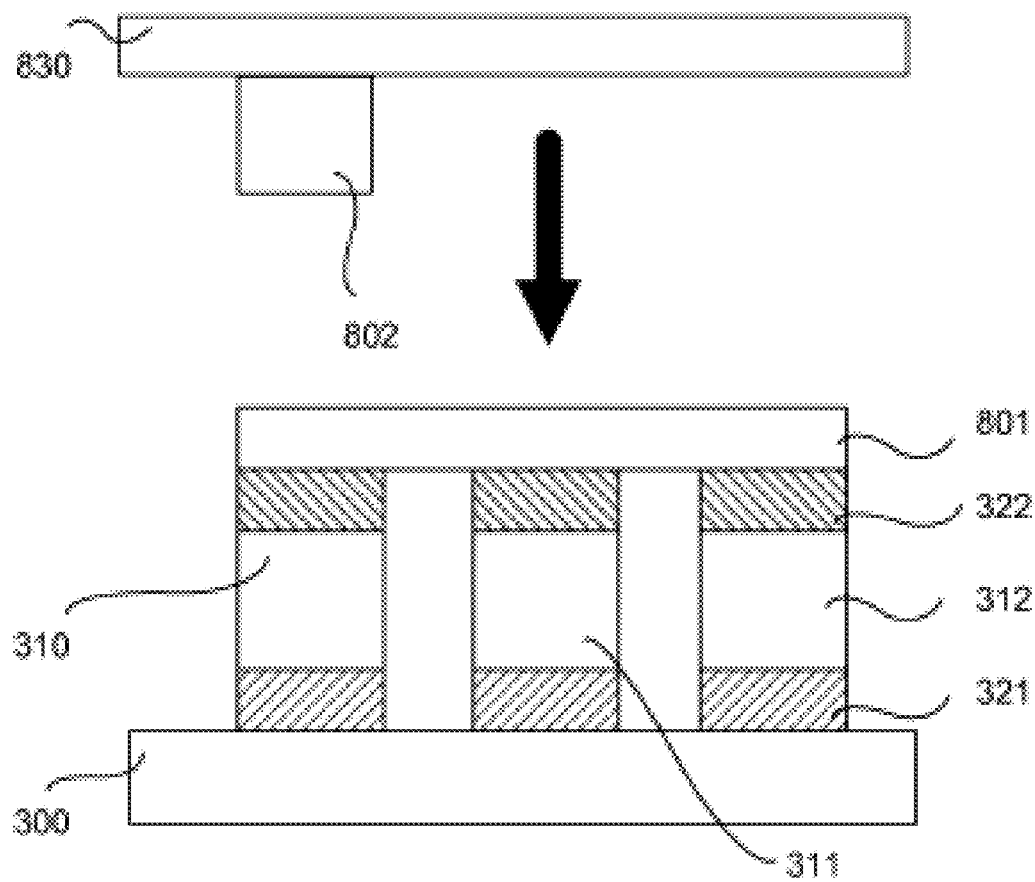
FIG. 8 shows an exemplary embodiment in which capping layers are deposited on a substrate.
Figure 9:
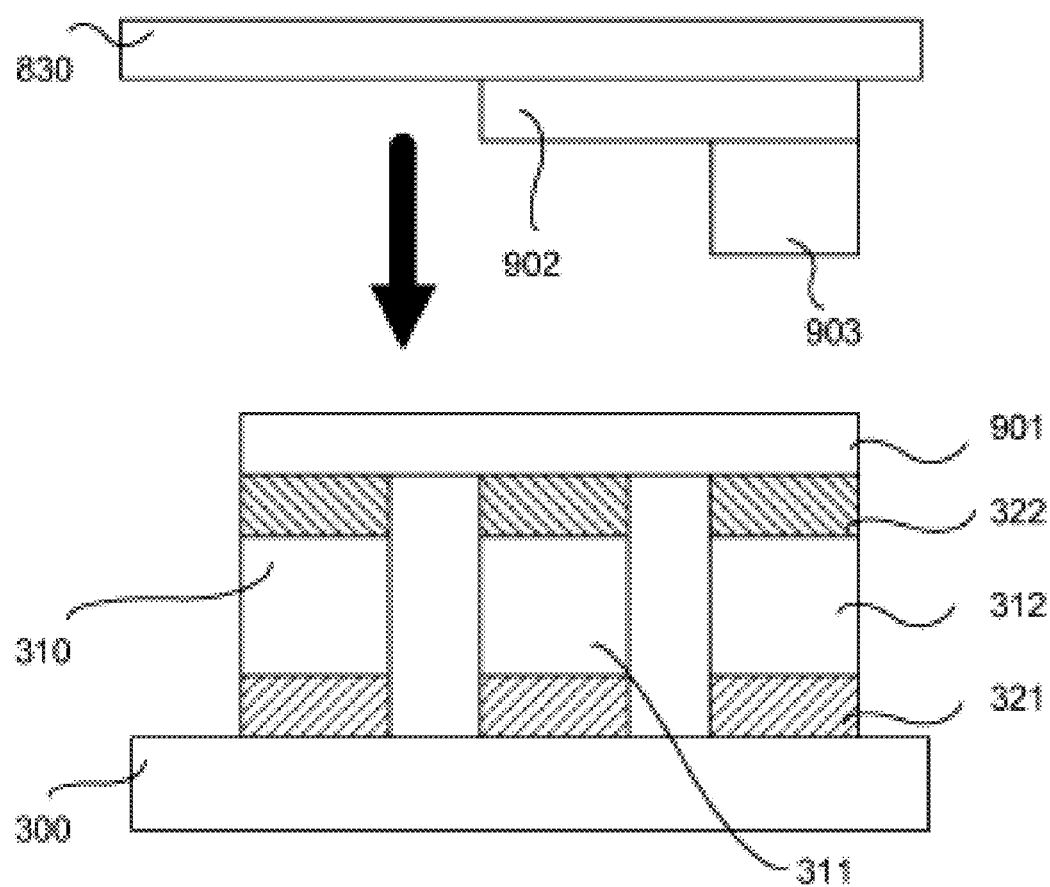
FIG. 9 shows an exemplary embodiment in which capping layers are deposited on a substrate.

In some embodiments, in the first method as described above in which a plurality of OLEDs are provided on a substrate and a first and second capping layer are deposited so as to be optically coupled to a first and second portion of the OLEDs, respectively, the step of depositing the second capping layer may comprise depositing the second capping layer onto portions of a second substrate and aligning the second capping layer over at least the second portion of the plurality of OLEDs. This is illustrated in FIGS. 8-9, and will be described in more detail below. Embodiments may permit deposition using any known technique, such as using at least one of photolithography, LITI, LIPS, stamping, or inkjet printing. Depositing the second capping layer on a second substrate may be less expensive and complex compared to deposition of the capping layers directly over the OLEDs (e.g. depositing the capping layers directly over the same substrate as the OLEDs) because, for instance, the deposition on the second substrate may be done without the risk of damaging the organic materials (which may be relatively sensitive to damage from other deposition and manufacturing processes). Moreover, if a manufacturing error was to occur in this deposition process, it would not be as costly as there are no other OLED materials disposed on the second substrate. Continuing with the exemplary embodiment whereby the second capping layer is deposited on a second substrate, in some embodiments, the step of aligning the second capping layer over at least the second portion of the plurality of OLEDs comprises depositing the second capping layer onto portions of the second substrate such that the second capping layer is over at least the second portion of the plurality of OLEDs when the second substrate is coupled to the first substrate. That is, for example, the second capping layer may be optically coupled to the second portion of the plurality of OLEDs when the first and second substrates are coupled. In this manner, a device (such as a display) may comprise multiple capping layers having different optical thicknesses that each optimize OLEDs having light emissions of different wavelengths—while not requiring direct deposition of the second capping layer over the OLEDs and/or the first capping layer. Moreover, in some embodiments, the first capping layer is optically coupled to the second capping layer when the first substrate is coupled to the second substrate. This may be the case, for instance, when the first capping layer is common to a plurality of OLEDs that emit light in different colors.

Continuing with the exemplary embodiment whereby the second capping layer is deposited on a second substrate, in some embodiments, the second substrate is a display cover. Moreover, in such embodiments, the coupling of the first and the second substrates can serve to encapsulate the organic devices. In this regard, materials in an OLED are sensitive to air and moisture, which can lead to degradation of the organic materials and/or quenching of excited states within the molecules if they are exposed to such atmospheric conditions. Utilizing the second substrate (which may comprise glass) in this manner can thereby serve multiple purposes.

In some embodiments, in the first method as described above in which a plurality of OLEDs are provided on a substrate and a first and second capping layer are deposited so as to be optically coupled to a first and second portion of the OLEDs, respectively, depositing the first capping layer may comprise either one of or some combination of FMM and VTE. This may be the case when the first capping layer is not common to all, or substantially all, of the OLED devices on the first substrate. In some embodiments, none of the capping layers are deposited by either one of or some combination of FMM and VTE. For example, in some embodiments, all of the capping layers may be deposited using LITI or LISP processes, which provide the advantages described above over traditional deposition processes. In this manner, embodiments may provide the advantage of not using an FMM, which can add to the complexity of manufacturing OLEDs, and also introduces various sources of error such as mask deformation.

In some embodiments, in the first method as described above in which a plurality of OLEDs are provided on a substrate and a first and second capping layer are deposited so as to be optically coupled to a first and second portion of the OLEDs, respectively, the plurality of OLEDs may include a plurality of red OLEDs, a plurality of green OLEDs, and a plurality of blue OLEDs. This is typically the case for most displays (and light panels), as most colors can be replicated by using the combination of red, green, and blue light, including white light. Moreover, the first and second portions of the plurality of OLEDs may each comprise OLEDs of particular colors, and in some embodiments there may not be any overlap. For instance, in some embodiments, the first portion of the plurality of OLEDs may comprise a plurality of blue OLEDs and/or the second portion of the plurality of OLEDs may comprise only a plurality of the green OLEDs and a plurality of the red OLEDs. It follows thereby that in some embodiments, the first capping layer (which is optically coupled to the first portion of the plurality of OLEDs i.e. the blue OLEDs) may be different than the second capping layer (which is optically coupled to the second portion of the plurality of OLEDs—i.e. the green and red OLEDs). In this manner, it is possible to have the first capping layer optimized for the light emissions in the blue spectrum (because the first capping layer may be optimized for only the blue OLEDs), while simultaneously optimizing the second capping layer for either the red or green OLEDs (or the second capping layer may have an optical thickness that is a compromise between the optimal optical thickness for each device). Moreover, in some embodiments, the second portion of the plurality of OLEDs comprises only a plurality of the red OLEDs or a plurality of the green OLEDs. The second capping layer may thereby be optimized for either of the light emissions of the green or red OLEDs.

In some embodiments, in the first method as described above in which a plurality of OLEDs are provided on a substrate and a first and second capping layer are deposited so as to be optically coupled to a first and second portion of the OLEDs, respectively, and in which the plurality of OLEDs include a plurality of red OLEDs, a plurality of green OLEDs, and a plurality of blue OLEDs, the plurality of OLEDs may also include a third portion of OLEDs that is different from the first and second portions. The method may further include the step of depositing a third capping layer over at least the third portion of the plurality of OLEDs such that the third capping layer is optically coupled to at least the third portion of the plurality of OLEDs. The addition of a third capping layer may allow for the optimization of the emissions for OLEDs having three different color emissions (e.g. red, blue, and green). Although it is possible to obtain three different optical thicknesses using only two depositions of capping layers, it may be more practical to utilize three deposition processes (as it may be difficult to provide three different thicknesses that each optimize the light emission from a different OLED color). Exemplary embodiments of such configurations are shown in FIGS. 3-7 and 9, and will be described in more detail below. In some embodiments, the third capping layer is not optically coupled to the first portion and the second portion of the plurality of OLEDs. That is, the third capping layer may not be common to all, or substantially all of the OLEDs of the device (i.e. it may not be a blanket layer). Moreover, by providing capping layers that are not common to all of the other OLEDs, embodiments may provide non-common capping layers that may be optimized for a particular subset of the OLEDs of a device (e.g. based on the color of the emission). In some embodiments, the third capping layer is not optically coupled to the first portion or the second portion of the plurality of OLEDs. This may provide for a unique optical thickness for the third capping layer (or a unique optical thickness for the total capping layer in optical communication with the third portion of the plurality of OLEDs), even in embodiments whereby the first and second capping layers are common to the third portion and either the first and/or second portion of OLEDs (see e.g. FIG. 7, discussed below). In some embodiments, the third capping layer is not deposited through a patterned mask and, preferably, through an FMM. Again, as described above, deposition through a FMM or other traditional deposition processes can be, for instance, cost prohibitive when providing multiple non-common capping layers. Thus, like the second capping layer, the inventors have recognized the benefits of depositing the third capping layer using these alternative techniques, such as using at least one of laser induced thermal imaging (LITI) or laser induced pattern-wise sublimation (LIPS). As noted above, embodiments and features described herein may be combined and utilized with methods of fabricating devices, and the devices themselves, that comprise non-common capping layers that are deposited using such alternative deposition techniques (i.e. not through the use of an FMM).

Continuing with exemplary embodiments in which the plurality of OLEDs include a plurality of red OLEDs, a plurality of green OLEDs, and a plurality of blue OLEDs, where the plurality of 0 LEDs also include a third portion of OLEDs that is different from the first and second portions, and where the first method further includes the step of depositing a third capping layer over at least the third portion of the plurality of OLEDs such that the third capping layer is optically coupled to at least the third portion of the plurality of OLEDs, the step of depositing the third capping layer may comprise depositing the third capping layer onto portions of a second substrate and aligning the third capping layer over the third portion of the plurality of OLEDs. This process was discussed above with regard to a similar deposition process for the second capping layer.

An exemplary embodiment whereby both the first and the second capping layer are deposited in such a manner is shown in FIG. 9, which will be described in more detail below. The third capping layer may be deposited onto the second substrate using, for example, at least one of photolithography, LITI, LIPS, stamping, or inkjet printing. As was described above, embodiments where the capping layer or layers are deposited on a second substrate allow for more options in the deposition process, typically a reduction in cost, and usually more error tolerance because the substrate does not comprise organic material which may often be sensitive to such processes. In some embodiments, the third capping layer may be aligned with the third portion of OLEDs by depositing the third capping layer onto portions of the second substrate such that the third capping layer is optically coupled to the third portion of the plurality of OLEDs when the second substrate is coupled to the first substrate. The third capping layer may also be optically coupled to the first capping layer when the first substrate is coupled to the second substrate. This may be the case in embodiments where the first capping layer is a blanket layer, or is common to both the first and third portions of the plurality of OLEDs. A non-limiting example of such an embodiment is shown in FIG. 9. In some embodiments, the second substrate is a display cover ad may serve to encapsulate the organic devices when it is coupled to the substrate that has the OLEDs disposed thereon.

Continuing with the first method as described above in which the plurality of OLEDs include a plurality of red OLEDs, a plurality of green OLEDs, and a plurality of blue OLEDs, where the plurality of OLEDs also includes a third portion of OLEDs that is different from the first and second portions, and where the method includes the step of depositing a third capping layer over at least the third portion of the plurality of OLEDs such that the third capping layer is optically coupled to at least the third portion of the plurality of OLEDs, the first, second, and third portions of the plurality of OLEDs may each comprise OLEDs of various different colors. For instance, in some embodiments the third portion of the plurality of OLEDs may comprise only a plurality of the red OLEDs, the second portion of the plurality of OLEDs may comprise only a plurality of the green OLEDs, and the first portion of the plurality of OLEDs may comprise only a plurality of the blue OLEDs. In this manner, it may be possible to optimize the total capping layer over each of the plurality of OLEDs (i.e. for each color). That is, the total capping layer over each OLED in the first portion of the plurality of OLEDs may be the same (and may optimize the blue emissions), the total capping layer over each OLED of the second portion may be the same (and may optimize the red emissions), and the total capping layer over each OLED of the third portion may be the same (and may optimize the green emissions). It should be understood that it is possible to have any color OLED comprise each of the first, second, and third portions of the plurality of OLEDs as described above. For instance, the third portion of the plurality of OLEDs may comprise only a plurality of the green OLEDs, the second portion of the plurality of OLEDs may comprise only a plurality of the red OLEDs, and the first portion of the plurality of OLEDs may comprise only a plurality of the blue OLEDs. It follows thereby that embodiments may also comprise any combination of the first, second, and third capping layers such that the total capping layer over each of the first, second, and third portion of OLEDs is optimized.

In some embodiments, in the first method as described above in which a plurality of OLEDs are provided on a substrate and a first and second capping layer are deposited so as to be optically coupled to a first and second portion of the OLEDs, respectively, and in which the plurality of OLEDs include a plurality of red OLEDs, a plurality of green OLEDs, and a plurality of blue OLEDs, the first capping layer may have a thickness that is optimized for at least one of the plurality of red OLEDs, green OLEDs, and blue OLEDs. That is, the first capping layer as described above may be designed to have an optical thickness to optimize the emissions of any of the OLEDs in the device, without the need for any additional capping layers. However, in some embodiments, it may be preferred that the first capping layer has a thickness that is optimized for the plurality of blue OLEDs. This is due in part to the fact that the blue emission is typically optimized by utilizing the least thick (i.e. thinnest) capping layer. It is preferred that the first capping layer have a thickness that optimizes the light emission for the shortest wavelength OLED because the first capping layer may then be a blanket layer such that it is common to all, or substantially all, of the OLEDs of the device. The second and third capping layers may then be disposed over the first capping layer and optically coupled to OLEDs that emit light having a higher wavelength because the optical thickness of the capping layer for these devices is usually greater. Thereby, the first capping layer can be used in conjunction with the second and third capping layers for a total capping layer over the second and third portions of the plurality of OLEDs. In some embodiments, the first capping layer has an optical thickness that is less than approximately 125 nm. In some embodiments, the first capping layer is within the range of 90 to 130 nm. This range typically includes the optical thickness to optimize the blue OLEDs.

In general, it may be preferred that to optimize the emissions of the OLEDs in the exemplary method, that the optical thickness of the capping layer (or layers) that is optically coupled to the OLED (having emissions of a particular wavelength—i.e. color) be set to approximately the quarter wavelength of the OLED light emission. This may thereby reduce interference patterns and establish a maximum as to the amount of light emissions. However, as would be understood by one of skill in the art, there are many optical thicknesses that may be chosen—in part due to the periodic nature of electromagnetic waves.

The capping layers may comprise many different characteristics. For instance, the first capping layer may comprise any suitable materials, such as those that are frequently used and known in the art, which may include $Alq_3$. In some embodiments, the first capping layer is substantially transparent for light having a wavelength approximately equal to a wavelength of light that is emitted by each OLED that the first capping layer is optically coupled to. It is preferred that the capping layer is transparent so as to reduce emission loses of the organic devices. In some embodiments, the first capping layer has an index of refraction that is approximately in the range of 1 and 2.5. Typically, the higher the index of refraction, the less physical thickness is needed for the capping layers (because the optical thickness is the product of the physical thickness and the index of refraction). However, the increase in index of refraction may also decrease the critical angle at the boundary of the capping layer and may introduce additional types of losses. Thus, it may preferable that the first capping layer has an index of refraction that is approximately within the range of 1.5 and 2. In some embodiments, the first capping layer has an optical thickness that results in a loss of efficiency for the plurality of green OLEDs that is within the range of approximately 5 to 10%. This loss may be due to the first capping layer having an optical thickness that is optimized for the blue emission OLEDs. Similarly, the first capping layer may have an optical thickness that results in a loss of efficiency for the plurality of red OLEDs that is within the range of approximately 25 to 35%—which again may be typical when the first capping layer is optimized for the blue OLEDs.

Furthermore, in some embodiments, the second capping layer may have a thickness that is optimized for the plurality of red OLEDs and/or the plurality of green OLEDs. When the second capping layer is optimized for the plurality of green OLEDs, it may have an optical thickness that is approximately within the range of 125 to 160 nm, which is a range of values for which the capping layer is optimized for green emission OLEDs. It should be noted that in some embodiments, such as when another capping layer (such as the first capping layer) is common to the second portion of OLEDs, that this range may correspond to the optical thickness of the total capping layer that is in optical communication with the second portion of the plurality of OLEDs. That is, in this exemplary embodiment, the second capping layer may have an optical thickness that is less than that needed to optimize the green OLEDs alone, but when the first and the second capping layers are combined, the total optical thickness may optimize the light emissions. This is illustrated in FIGS. 3, 5-9. Similar to the first capping layer, the second capping layer may comprise any suitable material, such as Alq3. The second capping layer may also be substantially transparent for light having a wavelength approximately equal to a wavelength of light that is emitted by each OLED that the second capping layer is optically coupled to. Moreover, similar to the first capping layer, in some embodiments, the second capping layer may have an index of refraction that is approximately in the range of 1 and 2.5 and preferably is approximately within the range of 1.5 and 2. This was described above with reference to the first capping layer.

In some embodiments, where the plurality of OLEDs also include a third portion of OLEDs that is different from the first and second portions, and where the method includes the step of depositing a third capping layer over at least the third portion of the plurality of OLEDs such that the third capping layer is optically coupled to at least the third portion of the plurality of OLEDs, the third capping layer may have an optical thickness that is optimized for any of the OLED colors. For instance, the optical thickness may be optimized for the plurality of red OLEDs and/or the plurality of green OLEDs. This may be the case in embodiments whereby the first or the second capping layer was optimized for the blue OLEDs. In some embodiments, when the third capping layer has an optical thickness that is optimized for the red OLEDs, the third capping layer has a thickness that is approximately within the range of 160 to 200 nm. As described above, when the first or the second capping layer is common to the third portion of the plurality of OLEDs, then the third capping layer may have an optical thickness such that the total optical thickness of the total capping layer that is optically coupled to the third portion of the plurality of OLEDs is optimized. As with the first and the second capping layers, the third capping layer may comprise any suitable material, such as $Alq_3$. The third capping layer may be substantially transparent for light having a wavelength approximately equal to a wavelength of light that is emitted by each OLED that the third capping layer is optically coupled to. Moreover, in some embodiments, the third capping layer may have an index of refraction that is approximately in the range of 1 and 2.5 and preferably approximately within the range of 1.5 and 2.

As was described above, the first, second, and third capping layers may each be designed so as to optimize one of the emission colors simultaneously. For instance, in some embodiments, the first capping layer has a thickness that is optimized for the plurality of blue OLEDs, the second capping layer has a thickness that is optimized for the plurality of green OLEDs, and the third capping layer has a thickness that is optimized for the plurality of red OLEDs. In such embodiments, the device as a whole may then operate at a higher efficiency because the emissions from each color OLED is also optimized. It should be noted that each capping layer by itself does not have to provide the entire optical thickness for optimizing an OLED, but may be designed to combine with other capping layers that are also optically coupled to an OLED. In some embodiments, the first capping layer has an optical thickness that is approximately within the range of 90 to 130 nm, the second capping layer has an optical thickness that is approximately within the range of 125 to 160 nm, and the third capping layer has an optical thickness that is approximately within the range of 160 to 200 nm This may correspond to the optimal thicknesses for optimizing blue, green, and red OLEDs respectively.

In addition to the exemplary methods described, provided herein are descriptions of exemplary apparatuses. Again, as described below, the embodiments are for illustration purposes only, and are not meant to be limiting. A first apparatus is provided that comprises a plurality of OLEDs, each OLED having a first electrode, a second electrode disposed over the first electrode; and an organic electroluminescent (EL) material disposed between the first and the second electrodes. In some embodiments, the OLEDs may be disposed over a common substrate such that there light emissions may combined (as in a display). The first apparatus further includes a first capping layer that is disposed over the second electrode of at least a first portion of the plurality of OLEDs such that the first capping layer is optically coupled to at least the first portion of the plurality of OLEDs. In this manner, the first capping layer may increase the efficiency of the emissions of at least the first portion of the plurality of OLEDs, as was described above. The first apparatus also comprises a second capping layer. The second capping layer may be disposed over the second electrode of at least a second portion of the plurality of OLEDs such that the second capping layer is optically coupled to the second portion of the plurality of OLEDs but not the first portion of the plurality of OLEDs. In this manner, the optical thickness of the total capping layer that is optically coupled to the second portion of the plurality of OLEDs (which may comprise the second capping layer alone or in some combination with another capping layer) may be different than that which is optically coupled to the first plurality of OLEDs. This may, in some embodiments, provide the ability to optimize more than a single color OLED in such devices.

In some embodiments, the second capping layer in the first apparatus described above was not deposited through a FMM or by VTE. That is, as was described in detail above, the capping layers may have been deposited using an alternative deposition technique that has not heretofore been utilized for disposing the capping layers on a device. In some embodiments, these techniques may include LITI and LIPS, which may be preferred because the capping layers are not electrically active. In some embodiments, the plurality of OLEDs comprise a plurality of red OLEDs, a plurality of blue OLEDs, and a plurality of green OLEDs, such as when the device comprises a display or a light fixture. Moreover, in some embodiments, the second capping layer of the first apparatus is not disposed over at least one of the plurality of red OLEDs, green OLEDs, and blue OLEDs. In this manner, it may be possible to have at least two of the OLEDs to be optically coupled to a total capping layer that has a different optical thickness than the other OLEDs. This may then allow for the optimization of the emission of at least two of the OLED colors. For instance, in some embodiments, the second capping layer is not disposed over the plurality of blue OLEDs. This may be the case when the first capping layer has an optical thickness that is optimized for the blue OLEDs such that an additional capping layer optically coupled to the blue OLEDs may not be necessary to achieve optimization.

In some embodiments, in the first apparatus as described above where the plurality of OLEDs comprise a plurality of red OLEDs, a plurality of blue OLEDs, and a plurality of green OLEDs, and where the plurality of OLEDs further comprise a third portion of OLEDs that is different from the first and second portions, the apparatus further comprises a third capping layer disposed over the second electrode of at least the third portion of the plurality of OLEDs such that the third capping layer is optically coupled to at least the third portion of the plurality of OLEDs. As was described above, the addition of a third capping layer may make it more readily achievable to optimize three separate OLED emission colors. In some embodiments, the third capping layer is not optically coupled to the first or the second portions of the plurality of OLEDs. An example of this embodiment is show in FIG. 4, described below. This may permit each capping layer to be designed so as to optimize the emissions of one portion of the plurality of OLEDs, without the need to combine the optical effect of the other capping layers. In some embodiments, the third capping layer was not deposited through a FMM or VTE, which provides the same benefits as was described above. In some embodiments, the second capping layer is not optically coupled to the plurality of blue OLEDs or the plurality of green OLEDs and the third capping layer is not optically coupled to the plurality of red OLEDs or the plurality of blue OLEDs. An example of this embodiment is shown FIG. 4, which will be described in detail below. The remaining figures will now be described in more detail. The figures represent exemplary embodiments and are not meant to be limiting. Many of the figures were referenced above, and thereby may pertain to the description provided as indicated.

Each of the exemplary devices shown in FIGS. 3-9 comprise a plurality of OLEDs (310, 311, and 312) that emit different colors (e.g. red, green, and blue respectively), each having a first electrode 321 and a second electrode 322, where the second electrode 322 are the top electrodes. Each of the OLEDs are disposed on a first substrate 300. The first substrate may, for instance, comprise a backplane and/or TFT substrate. The remaining characteristics will be described in detail with respect to each figure.

Figure 3:
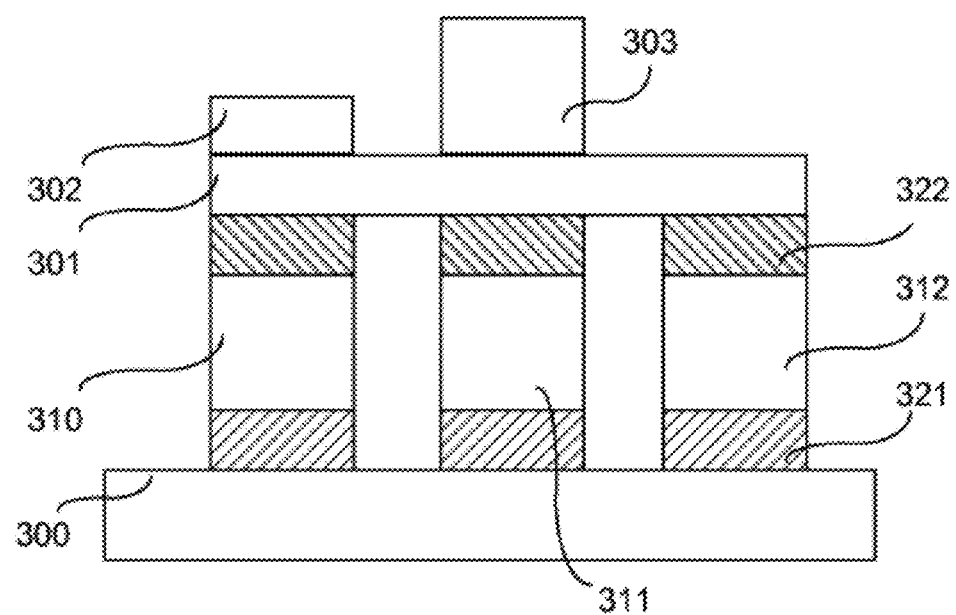
FIG. 3 shows a side view of an exemplary embodiment comprising a first capping layer, a second capping layer, and a third capping layer.

FIG. 3 shows a side view of an exemplary embodiment comprising a first capping layer 301, a second capping layer 302, and a third capping layer 303. As shown, the first capping layer 301 is disposed over the top electrode 322 of each of the OLEDs 310, 311, and 312 so as to be optically coupled to each organic device. Therefore, the first capping layer is common to OLEDs 310, 311, and 312. This may have the advantage of allowing the first capping layer 301 to be deposited as a blanket layer, and thus not require deposition through a FMM or other process. As depicted, the first capping layer may have an optical thickness that is optimized for the OLED 312 (e.g. the blue OLED). Also shown are a second capping layer 302 that is optically coupled to both the first capping layer 301 and OLED 310; as well as a third capping layer 303 that is optically coupled to the first capping layer 301 and the OLED 311. In some embodiments, the total capping layer of the first capping layer 301 and second capping layer 302 may have a total optical thickness that optimizes OLED 310. Similarly, in some embodiments, the total capping layer of the first capping layer 301 and third capping layer 303 may have a total optical thickness that optimizes OLED 311. Thus, as depicted in FIG. 3, the exemplary embodiment may comprise a single common capping layer 301 that optimizes one OLED 312, and a second 302 and third 303 capping layer so as to maximize the other OLEDs that may emit light of a different color. In this manner, the device in FIG. 3 may be optimized.

FIG. 4 shows a side view of an exemplary embodiment comprising a first capping layer 401, a second capping layer 402, and a third capping layer 403. Unlike the exemplary device in FIG. 3, the first capping layer 401 is not common to the plurality OLEDs 310, 311, and 312. Indeed, none of the capping layers are shown as optically coupled to any of the other capping layers, and none of the capping layers is common to a plurality of different color OLEDs. In this embodiment, each of the capping layers 401, 402, and 403 may have an optical thickness that optimizes each of the OLEDs 310, 311, and 312 respectively.

Figure 5:
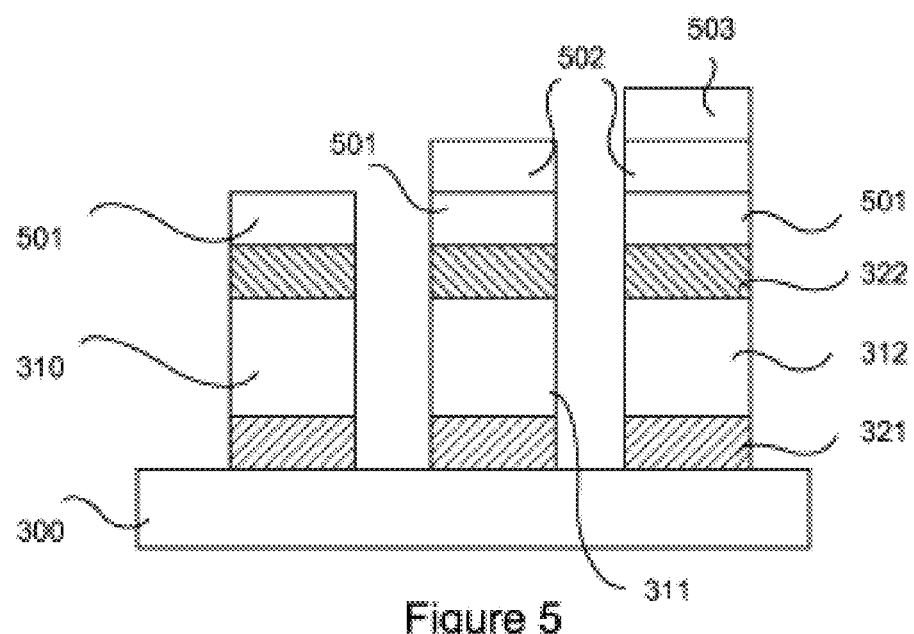
FIG. 5 shows a side view of an exemplary embodiment comprising a first capping layer, a second capping layer, and a third capping layer.

FIG. 5 shows a side view of an exemplary embodiment comprising a first capping layer 501, a second capping layer 502, and a third capping layer 503. As depicted, capping layer 501 is common to all three OLEDs and capping layer 502 is common to OLEDs 311 and 312. Capping layer 503 is optically coupled to only OLED 312. Each capping layer 501, 502, and 503 is shown has comprising the same optical thickness. However, the total optical thickness of the total capping layer for each OLED in FIG. 5 is different based on the difference in the number of depositions of the capping layers over each device. Thus, in these embodiments, it may be possible to apply the same deposition process and materials, but have three different capping layers—one for each of the different color OLEDs. It may also be possible to apply different materials having the same thickness.

Figure 6:
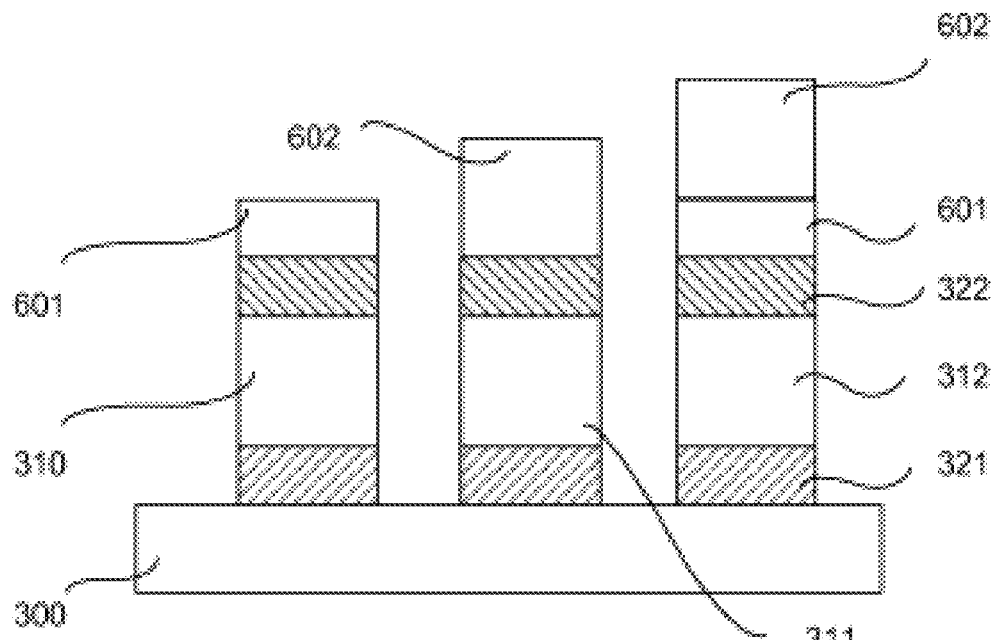
FIG. 6 shows a side view of an exemplary embodiment comprising a first capping layer and second capping layer.

FIG. 6 shows a side view of an exemplary embodiment comprising a first capping layer 601 and second capping layer 602. As shown, capping layer 601 is common to both OLED 310 and 312; and capping layer 602 is common to OLEDs 311 and 312. This embodiment illustrates that it is possible to have a device that comprises three different total capping layers while utilizing only two capping layers. That is, OLED 310 has a total capping layer comprising capping layer 601; OLED 311 has a total capping layer comprising capping layer 602; and OLED 312 has a total capping layer comprising capping layers 601 and 602. These embodiments have the advantage of only utilizing two deposition processes for depositing the capping layers, which may reduce time and costs of manufacturing.

Figure 7:
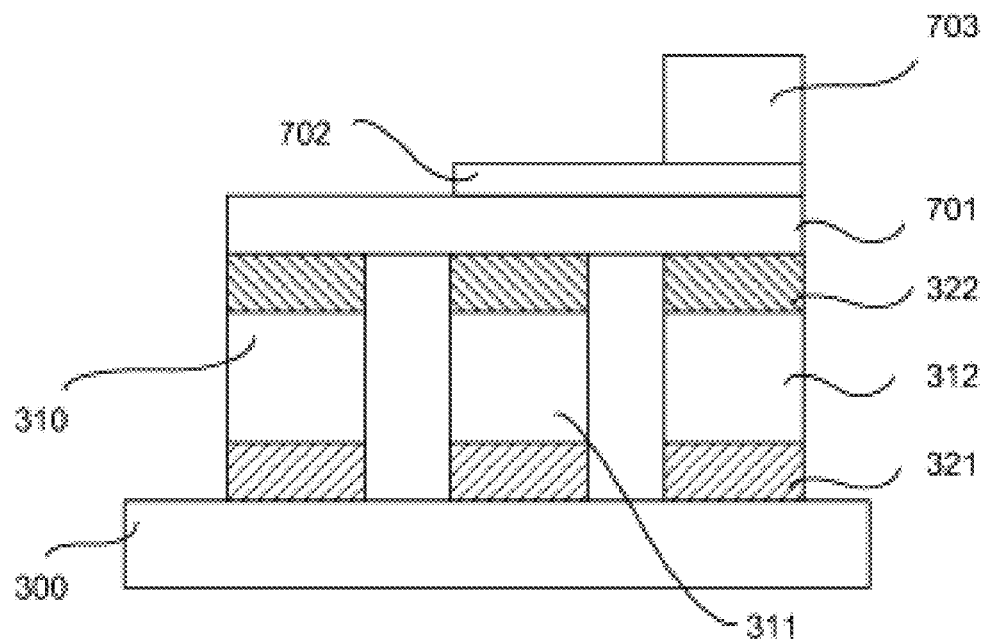
FIG. 7 shows a side view of an exemplary embodiment comprising a first capping layer, a second capping layer, and a third capping layer.

FIG. 7 shows a side view of an exemplary embodiment comprising a first capping layer 701, a second capping layer 702, and a third capping layer 703. As depicted, FIG. 7 is almost identical to FIG. 5 in that capping layer 701 is common to all three OLEDs, capping layer 702 is common to OLEDs 311 and 312, and capping layer 503 is optically coupled to only OLED 312. However, FIG. 7 shows an embodiment whereby the capping layers comprise different physical thicknesses. Thus, this embodiment may have the advantage of providing increased adaptability so as to more readily optimize the emissions of each of the OLEDs.

FIGS. 8 and 9 depict exemplary embodiments whereby the capping layers are deposited on a second substrate 830, such as a display panel, which is then coupled to the first substrate 300. As shown in FIG. 8, only a single capping layer 802 is disposed on the second substrate 830. The capping layer 802 is positioned such that when the substrates 300 and 830 are coupled, it is aligned with OLED 310. Thus, OLED 310 will be optically coupled to the common capping layer 801 and capping layer 802. Both OLEDs 311 and 312 are only optically coupled to capping layer 801. As was described above, this may be the case for embodiments whereby capping layer 801 is optimized for blue OLEDs. Typically in such exemplary embodiments, the red OLED (e.g. OLED 310 in FIG. 8) has the greatest loss of efficiency. Thus providing capping layer 802 may offset or optimize OLED 310. It should be understood that some or all of the capping layers may be deposited on the second substrate 830, and in any combination, such as those discussed with reference to FIGS. 3-7.

FIG. 9 is similar to FIG. 8 in that the capping layers 902 and 903 are disposed on the second substrate 830, which may then be aligned and coupled to the first substrate 300. As shown, when the first 300 and second 830 substrate are coupled, capping layer 901 is common to all three OLEDs, capping layer 902 is common to OLEDs 311 and 312, and capping layer 903 is optically coupled to only OLED 312. Thus, the result is similar to the net effect provided by the capping layers in FIGS. 5 and 7.

It should be appreciated that many more combinations of capping layers having the same or different optical properties may be provided so as to obtain different total optical thicknesses optically coupled to each of a plurality of different color OLED devices. However, the general principles remain the same as disclosed herein and are thereby contemplated as being within embodiments.

Also provided is a means to improve blue lifetime through use two blue sub-pixels of different color. For example, a deep blue which can render a saturated blue color may be used in conjunction with and a lighter blue which can provide blue for most images, except for those requiring deep blue. As a lighter blue generally has improved lifetime over a deep blue, this architecture also may reduce image sticking. For example, in some configurations the deep blue may be activated for about 50× less time than in a standard architecture using a single blue device. Thus, even accounting for 1.3× less available pixel areas compared to a conventional quad pixel arrangement that uses equal sub-pixel sizes, the lifetime of the second blue device may be improved by up to a factor of 700×. In this configuration the lifetime of the light blue device may be the limiting factor on the lifetime of the device. The use of two blue sub-pixels may extend display lifetime by up to a factor of 5 or more.

Figure 10:
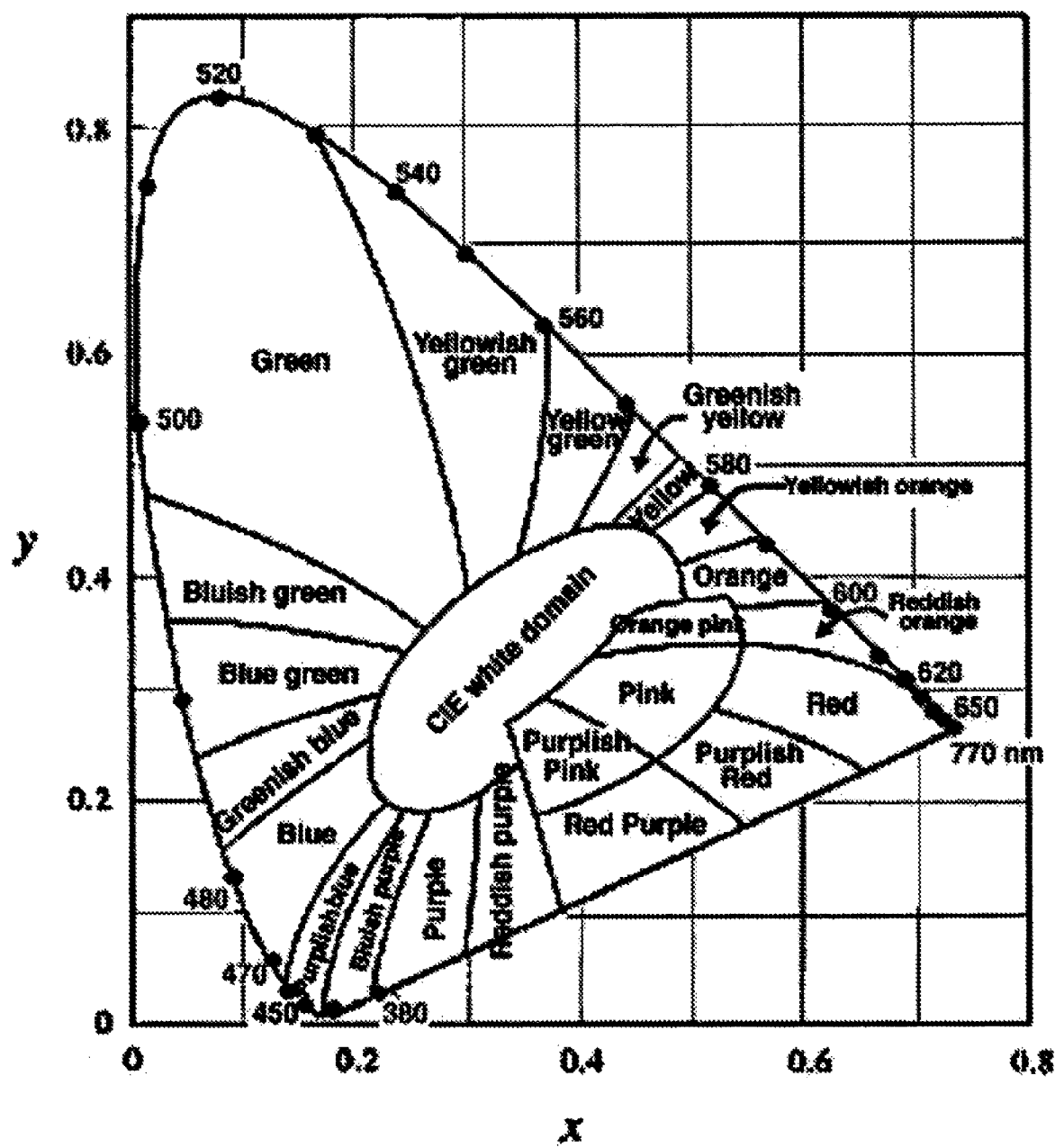
FIG. 10 shows the 1931 CIE chromaticity diagram.

FIG. 10 shows the 1931 CIE chromaticity diagram, developed in 1931 by the International Commission on Illumination, usually known as the CIE for its French name Commission Internationale de l'Eclairage. Any color can be described by its x and y coordinates on this diagram. A "saturated" color, in the strictest sense, is a color having a point spectrum, which falls on the CIE diagram along the U-shaped curve running from blue through green to red. The numbers along this curve refer to the wavelength of the point spectrum. Lasers emit light having a point spectrum.

Figure 11:
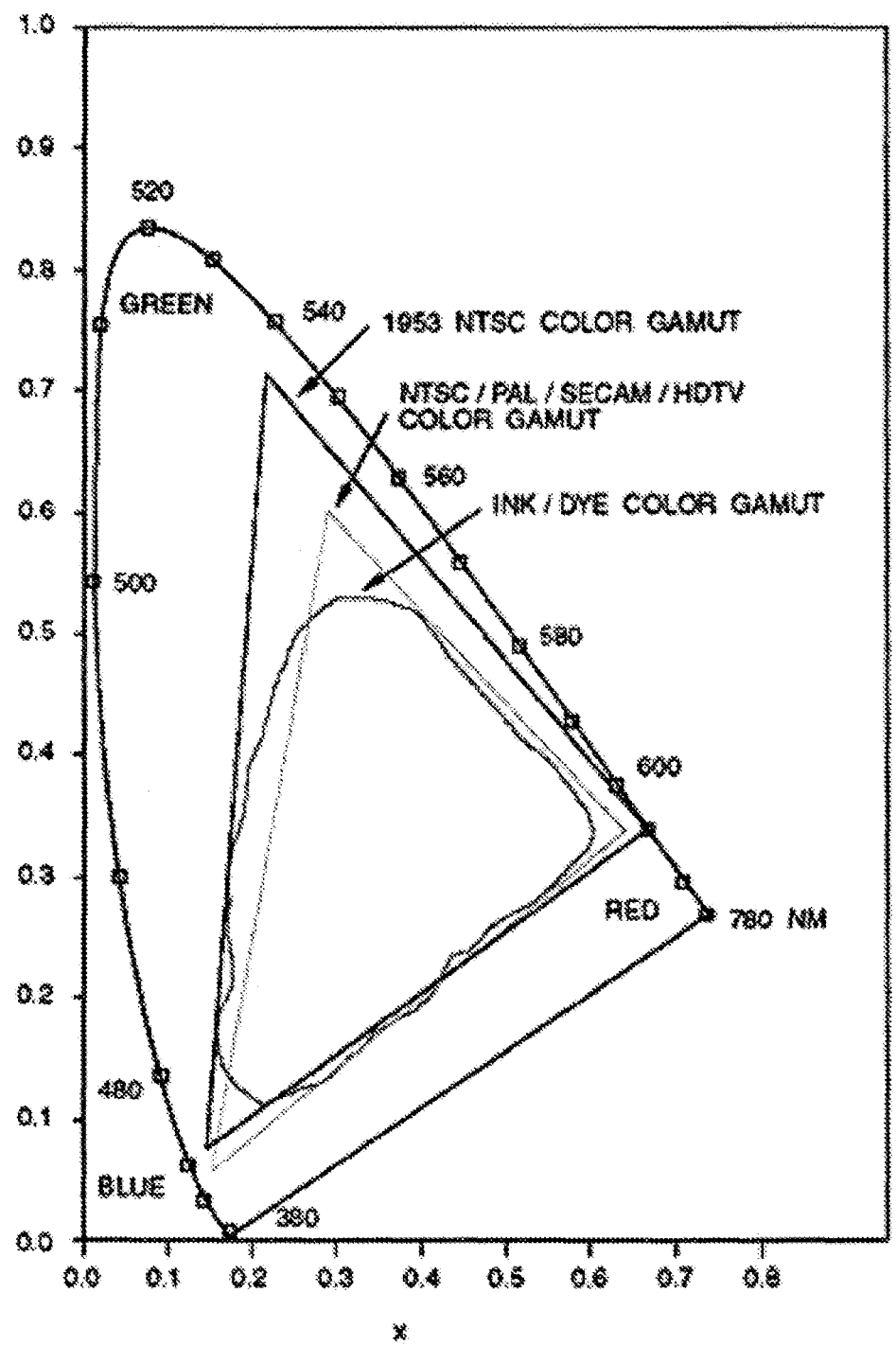
FIG. 11 shows the 1931 CIE chromaticity diagram including several color gamuts.

FIG. 11 shows another rendition of the 1931 chromaticity diagram, which also shows several color "gamuts." A color gamut is a set of colors that may be rendered by a particular display or other means of rendering color. In general, any given light emitting device has an emission spectrum with a particular CIE coordinate. Emission from two devices can be combined in various intensities to render color having a CIE coordinate anywhere on the line between the CIE coordinates of the two devices. Emission from three devices can be combined in various intensities to render color having a CIE coordinate anywhere in the triangle defined by the respective coordinates of the three devices on the CIE diagram. The three points of each of the triangles in FIG. 11 represent industry standard CIE coordinates for displays. For example, the three points of the triangle labeled "NTSC I PAL I SECAM I HDTV gamut" represent the colors of red, green and blue (RGB) called for in the sub-pixels of a display that complies with the standards listed. A pixel having sub-pixels that emit the RGB colors called for can render any color inside the triangle by adjusting the intensity of emission from each subpixel.

A full color display using phosphorescent OLEDS is desirable for many reasons, including the theoretical high efficiency of such devices, cost advantages, and device flexibility. While the industry has achieved red and green phosphorescent devices that have high efficiency and long lifetimes suitable for use in displays, there may still be issues with blue phosphorescent devices, and particularly blue phosphorescent devices that have the CIE coordinates called for by industry standards such as HDTV and NTSC. The CIE coordinates called for by NTSC standards are: red (0.67, 0.33); green (0.21, 0.72); blue (0.14, 0.08). There are devices having suitable lifetime and efficiency properties that are close to the blue called for by industry standards, but far enough from the standard blue that the display fabricated with such devices instead of the standard blue would have noticeable shortcomings in rendering blues. The blue called for industry standards is a "deep" blue as defined below, and the colors emitted by efficient and long-lived blue phosphorescent devices are generally "light" blues as defined below.

A display is provided which allows for the use of highly efficient and long-lived phosphorescent devices, including red, green and light blue phosphorescent devices, while still allowing for the rendition of colors that include a deep blue component. This is achieved by using a quad pixel, i.e., a pixel with four devices. Three of the devices are highly efficient and long-lived phosphorescent devices, emitting red, green and light blue light, respectively. The fourth device emits deep blue light, and may be less efficient or less long lived that the other devices. However, because many colors can be rendered without using the fourth device, its use can be limited such that the overall lifetime and efficiency of the display does not suffer much from its inclusion.

A device is provided. The device has a first organic light emitting device, a second organic light emitting device, a third organic light emitting device, and a fourth organic light emitting device. The device may be a pixel of a display having four sub-pixels. A preferred use of the device is in an active matrix organic light emitting display, which is a type of device where the shortcomings of deep blue OLEDs are currently a limiting factor.

The first organic light emitting device emits red light, the second organic light emitting device emits green light, the third organic light emitting device emits light blue light, and the fourth organic light emitting device emits deep blue light. The peak emissive wavelength of the third and fourth devices differ by at least 4 nm. As used herein, "red" means having a peak wavelength in the visible spectrum of 600-700 nm, "green" means having a peak wavelength in the visible spectrum of 500-600 nm, "light blue" means having a peak wavelength in the visible spectrum of 470-500 nm, and "deep blue" means having a peak wavelength in the visible spectrum of 400-470 nm. In some configurations disclosed herein where a distinction between light and deep blue is not required, "blue" means having a peak wavelength in the visible spectrum of 400-500 nm. Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 470-500 nm that is at least 4 nm greater than that of a deep blue OLED in the same device, as preferably having a CIE x-coordinate less than 0.2 and a CIE y-coordinate less than 0.5, and "deep blue" may be further defined, in addition to having a peak wavelength in the visible spectrum of 400-470 nm, as preferably having a CIE y-coordinate less than 0.15 and preferably less than 0.1, and the difference between the two may be further defined such that the CIE coordinates of light emitted by the third organic light emitting device and the CIE coordinates of light emitted by the fourth organic light emitting device are sufficiently different that the difference in the CIE xcoordinates plus the difference in the CIE y-coordinates is at least 0.01. As defined herein, the peak wavelength is the primary characteristic that defines light and deep blue, and the CIE coordinates are preferred.

The first, second and third organic light emitting devices each have an emissive layer that includes a phosphorescent organic material that emits light when an appropriate voltage is applied across the device. The fourth organic light emitting device has an emissive layer that includes an organic emissive material, which may be phosphorescent or fluorescent, which emits light when an appropriate voltage is applied across the device. "Red" and "green" phosphorescent devices having lifetimes and efficiencies suitable for use in a commercial display are well known and readily achievable, including devices that emit light sufficiently close to the various industry standard reds and greens for use in a display. Examples of such devices are provided in M. S. Weaver, V. Adamovich, B. D' Andrade, B. Ma, R. Kwong, and J. J. Brown, Proceedings of the International Display Manufacturing Conference, pp. 328-331 (2007); see also B. D' Andrade, M. S. Weaver, P. B. MacKenzie, H. Yamamoto, J. J. Brown, N. C. Giebink, S. R. Forrest and M. E. Thompson, Society for Information Display Digest of Technical Papers 34, 2, pp. 712-715 (2008).

"Light blue" phosphorescent devices having desirable lifetime and efficiency properties are also readily achievable. Such devices may be used in displays without adversely affecting the lifetime or efficiency of the display. However, a display relying on a light blue device may not be able to properly render colors requiring a deep blue component. An example of a suitable light blue device has the structure:

ITO (80 nm)/Compound C (30 nm)/NPD (10 nm)/Compound A: Emitter A (30 nm:20%)/Compound A (5 nm)/LG201 (30 nm)/LiF (1 nm)/Al (100 nm)

LG201 is available from LG Chem. Ltd. of Korea.

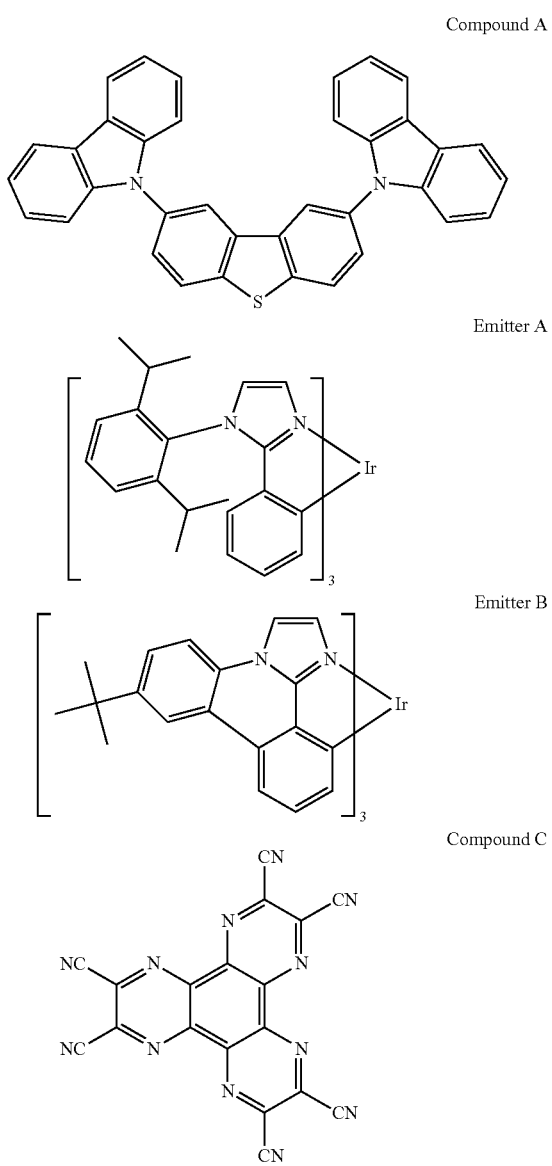

Such a device has been measured to have a lifetime of 6.3 khrs from initial luminance 1000 nits at constant dc current to 50% of initial luminance, 1931 CIE coordinates of CIE (0.176, 0.377), and a peak emission wavelength of 476 nm in the visible spectrum.

"Deep blue" devices are also readily achievable, but not necessarily having the lifetime and efficiency properties desired for a display suitable for consumer use. One way to achieve a deep blue device is by using a fluorescent emissive material that emits deep blue, but does not have the high efficiency of a phosphorescent device. An example of a deep blue fluorescent device is provided in Masakazu Funahashi et al., Society for Information Display Digest of Technical Papers 47. 3, pp. 709-711 (2008). Funahashi discloses a deep blue fluorescent device having CIE coordinates of (0.140, 0.133) and a peak wavelength of 460 nm. Another way is to use a phosphorescent device having a phosphorescent emissive material that emits light blue, and to adjust the spectrum of light emitted by the device through the use of filters or microcavities. Filters or microcavities can be used to achieve a deep blue device, as described in Baek-woon Lee, Young In Hwang, Hae-yeon Lee and Chi Woo Kim and Young-gu Ju Society for Information Display Digest of Technical Papers 68.4, pp. 1050-1053 (2008), but there may be an associated decrease in device efficiency. Indeed, the same emitter may be used to fabricate a light blue and a deep blue device, due to microcavity differences. Another way is to use available deep blue phosphorescent emissive materials, such as described in United States Patent Publication 2005/0258433, which is incorporated by reference in its entirety and for compounds shown at pages 7-14. However, such devices may have lifetime issues. An example of a suitable deep blue device using a phosphorescent emitter has the structure:

ITO (80 nm)/Compound C (30 nm)/NPD (10 nm)/Compound A: Emitter B (30 nm:9%)/Compound A (5 nm)/Alq$_3$ (30 nm)/LiF (1 nm)/Al (100 nm)

25 Such a device has been measured to have a lifetime of 600 hrs from initial luminance 1000 nits at constant de current to 50% of initial luminance, 1931 CIE coordinates of CIE: (0.148, 0.191), and a peak emissive wavelength of 462 nm.

The difference in the performance of available deep blue and light blue devices may be significant. For example, a deep blue device may have good efficiency, but a lifetime that is less than 50% or less than 25% of that of a light blue device. Such a difference in lifetime may describe many deep blue phosphorescent devices. A standard way to measure lifetime is LT50 at an initial luminance of 1000 nits, i.e., the time required for the light output of a device to fall by 50% when run at a constant current that results in an initial luminance of 1000 nits. Or, a deep blue device may have a good lifetime, but an efficiency that is less than 80% or less than 40% of that of a light blue device. Such a difference in efficiency may describe many fluorescent deep blue devices, or deep blue devices obtained by color-shifting the emission from a light blue phosphorescent emitter, for example by using microcavities.

Figure 12:
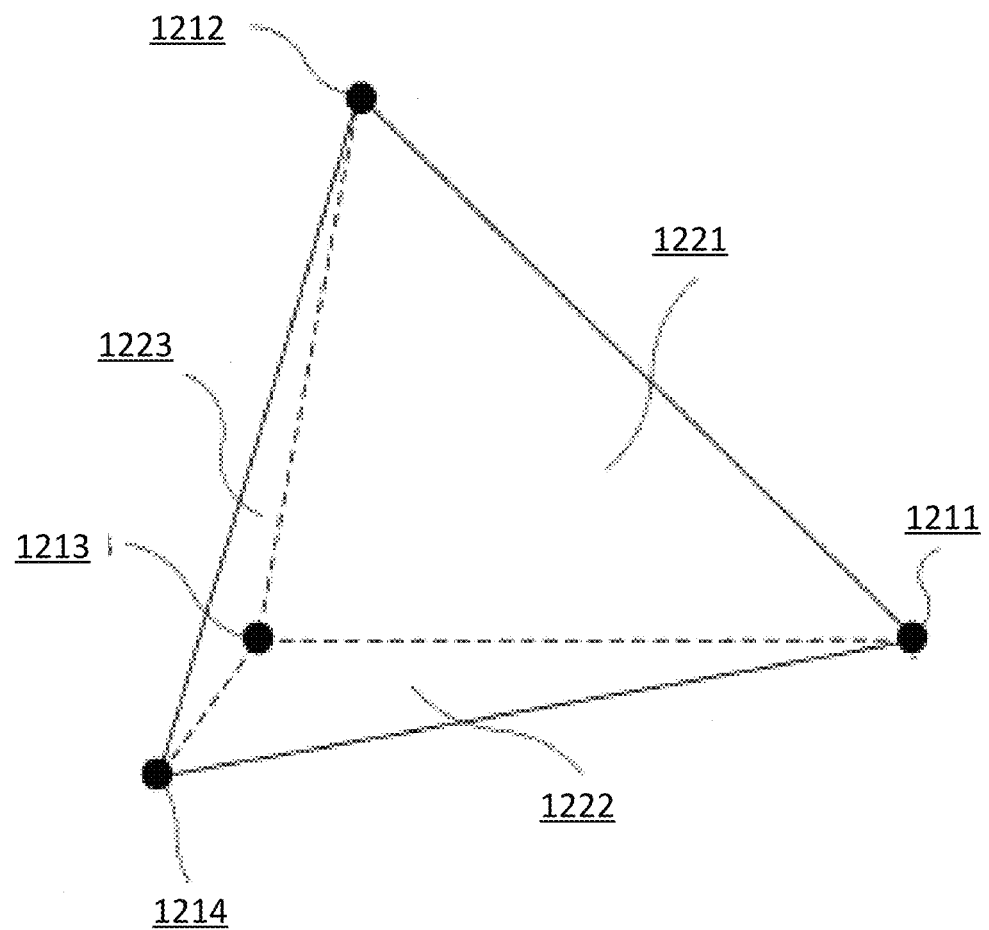
FIG. 12 shows CIE coordinates of a group of example emissive devices in an embodiment.

A device or pixel having four organic light emitting devices, one red, one green, one light blue and one deep blue, may be used to render any color inside the shape defined by the CIE coordinates of the light emitted by the devices on a CIE chromaticity diagram. FIG. 12 .illustrates this point. FIG. 12 should be considered with reference to the CIE diagrams of FIGS. 10 and 11, but the actual CIE diagram is not shown in FIG. 12 to make the illustration clearer. In FIG. 12, point 1211 represents the CIE coordinates of a red device, point 1212 represents the CIE coordinates of a green device, point 1213 represents the CIE coordinates of a light blue device, and point 1214 represents the CIE coordinates of a deep blue device. The pixel may be used to render any color inside the triangle defined by points 1211, 1212 and 1214. If the CIE coordinates of points 1211, 1212 and 1214 correspond to, or at least encircle, the CIE coordinates of devices called for by a standard gamut—such as the corners of the triangles in FIG. 11—the device may be used to render any color in that gamut.

However, because there is also a light blue device that emits light having CIE coordinates represented by point 1213, many of the colors inside the triangle defined by points 1211, 1212 and 1214 can be rendered without using the deep blue device. Specifically, any color inside the triangle defined by points 1211, 1212 and 1213 may be rendered without using the deep blue device. The deep blue device would only be needed for colors inside the triangle defined by points 1211, 1213 and 1214, or inside the triangle defined by points 1212, 1213 and 1214. Depending upon the color content of the images in question, only minimal use of the deep blue device may be needed. In addition, for colors where the deep blue device is needed, i.e., for colors inside the triangle defined by points 1211, 1213 and 1214, or inside the triangle defined by points 1212, 1213 and 1214, the contribution needed from the deep blue device may be much less when the light blue device is being used, because, for many of these colors, much of the blue contribution can come from the light blue device. For example, for a color having a CIE coordinate much closer to point 1213 than any of the other points, most or all of the contribution would come from the light blue device. In a comparable pixel without a light blue device, most or all of the contribution would come from the deep blue device, which is closest to point 1213.

Although FIG. 12 shows a "light blue" device having CIE coordinates 1213 that are inside the triangle defined by the CIE coordinates 1211, 1212 and 1214 of the red, green and deep blue devices, respectively, the light blue device may have CIE coordinates that fall outside of said triangle. For example, CIE coordinates for a light blue device may fall to the left of the line between coordinates 1212 and 1214, and still meet the definition of "light blue" included herein.

A preferred way to operate a device having a red, green, light blue and deep blue device, or first, second, third and fourth devices, respectively, as described herein is to render a color by using only the devices that define the smallest triangle in CIE space that include the color. Thus, points 1211, 1212 and 1213 define a first triangle 1221 in the CIE space; points 1211, 1212 and 1214 define a second triangle 1222 in the CIE space; and points 1212, 1213 and 1214 define a third triangle 1223 in the CIE space. If a desired color has CIE coordinates falling within the first triangle, only the first, second and third devices, but not the fourth device, are used to render the color. If a desired color has CIE coordinates falling within the second triangle, only the first, third and fourth devices, but not the second device, are used to render the color. If a desired color has CIE coordinates falling within the third triangle, only the second, third and fourth devices, but not the first device, are used to render the color.

Such a device could be operated in other ways as well. For example, light having the CIE coordinates of the light blue device may be achieved by using a combination of the deep blue device, the red device and the green device, and such light could be used in whole or in part to replace the contribution of the light blue device. However, such use would not achieve the purpose of minimizing use of the deep blue device.

Algorithms have been developed in conjunction with RGBW (red, green, blue, white) devices that may be used to map a RGB color to an RGBW color. Similar algorithms may be used to map an RGB color to RGB1B2. Such algorithms, and RGBW devices generally, are disclosed in A. Arnold, T.

K. Hatwar, M. Hettel, P. Kane, M. Miller, M. Murdoch, J. Spindler, S. V. Slyke, Proc. Asia Display (2004); J. P. Spindler, T. K. Hatwar, M. E. Miller, A. D. Arnold, M. J. Murdoch, P. J. Lane, J. E. Ludwicki and S. V. Slyke, SID 2005 International Symposium Technical Digest 36, 1, pp. 36-39 (2005) ("Spindler"); Du-Zen Peng, Hsiang-Lun, Hsu and Ryuji Nishikawa. Information Display 23, 2, pp 12-18 (2007) ("Peng"); B-W. Lee, Y. I. Hwang, H-Y, Lee and C. H. Kim, SID 2008 International Symposium Technical Digest 39, 2, pp. 1050-1053 (2008). RGBW displays are significantly different from those disclosed herein because they still need a good deep blue device. Moreover, there is teaching that the "fourth" or white device of an RGBW display should have particular "white" CIE coordinates, see Spindler at 37 and Peng at 13.

Figure 13:
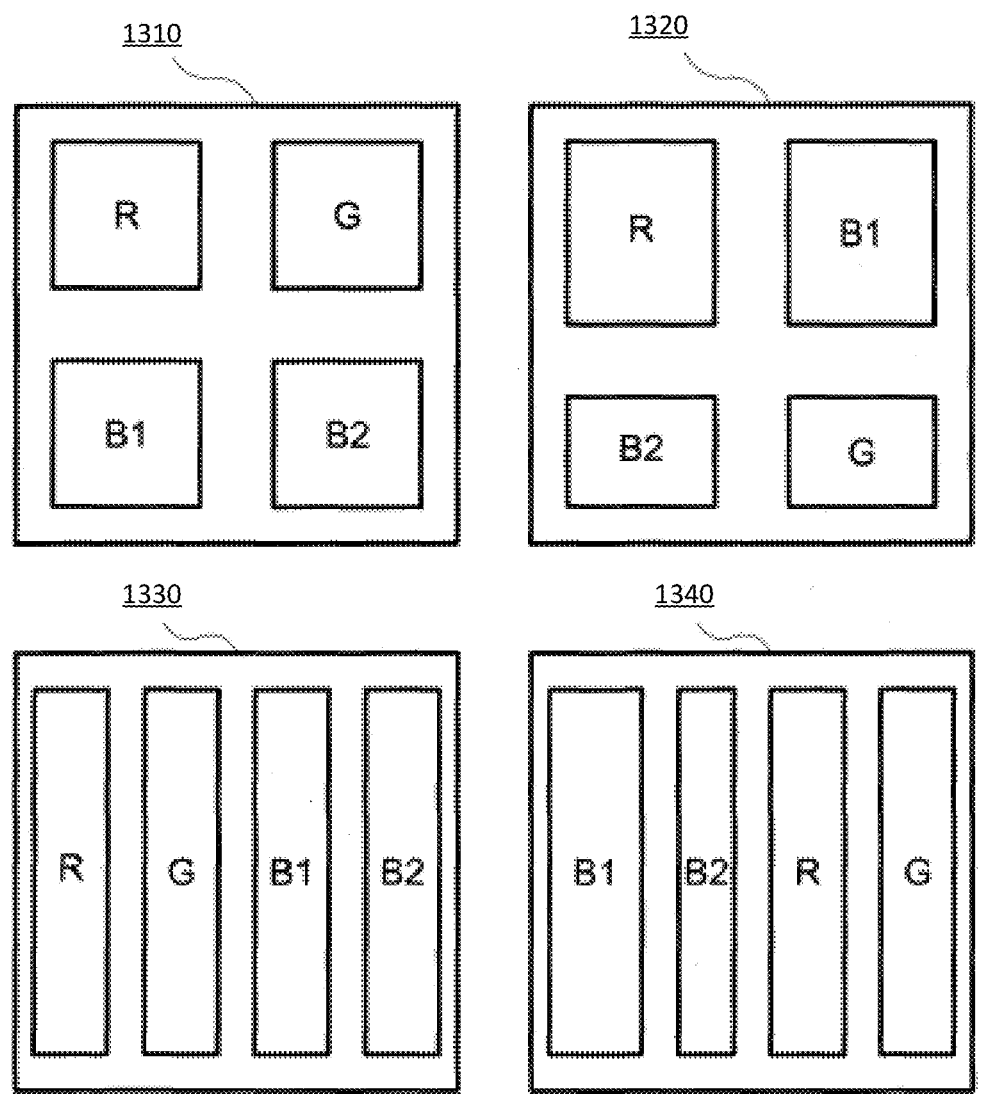
FIG. 13 shows example configurations of example embodiments having four different organic light emitting devices.

A device having four different organic light emitting devices, each emitting a different color, may have a number of different configurations. FIG. 13 illustrates some of these configurations. In FIG. 13, R is a red-emitting device, G is a green-emitting device, B1 is a light blue emitting device, and B2 is a deep blue emitting device.

Configuration 1310 shows a quad configuration, where the four organic light emitting devices making up the overall device or multicolor pixel are arranged in a two by two array. Each of the individual organic light emitting devices in configuration 1310 has the same surface area. In a quad pattern, each pixel could use two gate lines and two data lines.

Configuration 1320 shows a quad configuration where some of the devices have surface areas different from the others. It may be desirable to use different surface areas for a variety of reasons. For example, a device having a larger area may be run at a lower current than a similar device with a smaller area to emit the same amount of light. The lower current may increase device lifetime. Thus, using a relatively larger device is one way to compensate for devices having a lower expected lifetime.

Configuration 1330 shows equally sized devices arranged in a row, and configuration 1340 shows devices arranged in a row where some of the devices have different areas. Patterns other than those specifically illustrated may be used.

Other configurations may be used. For example, a stacked OLED with four separately controllable emissive layers, or two stacked OLEDs each with two separately controllable emissive layers, may be used to achieve four sub-pixels that can each emit a different color of light.

Various types of OLEDs may be used to implement various configurations, including transparent OLEDs and flexible OLEDs.

Displays with devices having four sub-pixels, in any of the various configurations illustrated and in other configurations, may be fabricated and patterned using any of a number of conventional techniques. Examples include shadow mask, laser induced thermal imaging (LITI), ink-jet printing, organic vapor jet printing (OVJP), or other OLED patterning technology. An extra masking or patterning step may be needed for the emissive layer of the fourth device, which may increase fabrication time. The material cost may also be somewhat higher than for a conventional display. These additional costs would be offset by improved display performance.

A single pixel may incorporate more than the four sub-pixels disclosed herein, possibly with more than four discrete colors. However, due to manufacturing concerns, four sub-pixels per pixel is preferred.

Another technique that may be used to decrease image sticking and/or improve blue pixel performance is the use of a mixed host EML. Typically the application of a mixed host system to red and green EMLs compared to a single host EML improves the lifetime of the device by a factor of 2-3x. Similar improvements in lifetime may be achieved by using a mixed host EML in a blue EML. It may be desirable to use materials for the mixed host that have specific relationships among the energy levels of the materials. In an example embodiment, it may be preferred for the HOMO of the second host material to be between the HOMO of the first host material and the HOMO of the emissive material. Alternatively or in addition, it may be preferred for the LUMO of the second host material is between the LUMO of the first host material and the LUMO of the emissive material. It also may be desirable for energy levels of the host materials to be relatively close to corresponding energy levels of the emissive material. For example, it may be preferred for the HOMO of the first host material to be within about 0.2-0.4 eV of the HOMO of the emissive material, for the LUMO of the second host material to be within about 0.2-0.4 eV of the LUMO of the emissive material, for the HOMO of the first host material to be within about 0.2-0.4 eV of the HOMO of the emissive material, and/or for the LUMO of the second host material to be within about 0.2-0.4 eV of the LUMO of the emissive material, or combinations thereof.

The disclosed relationship may allow most charges to be transported by the hosts before recombination, thus allowing exciton emission to occur on the emitter. This enables an efficiency improvement due to fewer polaron-exciton interactions, and a higher PLQY may be achieved due to the ability to reduce the emitter concentration as the emitter now does not need to transport charge. The efficiency enhancement leads to an increase in device lifetime and lower drive current for a given luminance, and because less excitation of the emitter molecules occurs as they carry fewer polarons and exciton-polaron events on the emitter become less likely.

Additional details regarding the use of a mixed host EML are provided in PCT Publication No. WO 2007/124172 and U.S. Patent Application Pub. 2007/0247061, the disclosure of each of which is incorporated by reference in its entirety for all purposes.

Another provided technique to improve blue lifetime and/or image sticking in a device is the use of one or more high T1 transport layers adjacent to a blue EML, typically a phosphorescent blue EML, i.e. a transport layer having a first excited triplet state that is higher than the first excited triplet state of the emitter. In an example configuration, the transport layer may have a first excited triplet state of 2.6 eV or higher. This may be the case, for example, where a device includes phosphorescent red and green devices and a fluorescent blue device. As another example, the transport layer may have a first excited triplet state of 2.8 eV or higher, as may result when a phosphorescent blue device is used.

For a blue device, the use of a high T1 transport layer may increase the efficiency of the device by up to about 20% or more. Because for a given luminance the current may be reduced as the efficiency of a device increases, the lifetime of the device may be expected to be increased by a factor of up to about 1.4x or more compared to a device that does not use a high T1 transport layer. High T1 transport layers are described in further detail in N. Chopra, J, Lee, F. So, IEEE Transactions on Electron Devices, 57 (1) p. 101 (2010).

Some OLED displays and similar devices may have lifetimes limited by the lifetime of one or more sub-pixel types. For example, some conventional displays use a display region having multiple pixels, where each pixel includes at least one red, green, and blue sub-pixel. One color sub-pixel, most commonly blue, will typically have a shorter average lifetime than the other sub-pixels, thus limiting the lifetime of the device as a whole.

It has been found that the lifetime of a sub-pixel device may be increased by using a stacked device configuration. Thus, another provided technique for improving blue device lifetime and/or image sticking is the use of a stacked blue sub-pixel in conjunction with single emissive layer red and/or green sub-pixels. Such a configuration may provide an increase in the lifetime of the blue device of a factor of up to about 3.5× or more for a device having two emissive layers in the stack. Configurations using additional emissive layers in the stack may provide additional increases in the lifetime of the blue device.

In such a device, the luminance provided by each emissive layer of the device, as well as the current through the layer, may be reduced, thus increasing the lifetime of the device. In an embodiment of the invention, fewer than all of the sub-pixels in a region may use a stacked configuration. For example, a device may use single emissive layer red and green sub-pixels, and stacked blue sub-pixels. As used herein, a "single emissive layer" device refers to a device that includes only a single emissive region disposed between two electrodes, without second or additional emissive regions disposed between the electrodes. Configurations having at least one stacked sub-pixel, but fewer than all of the sub-pixels in a stacked configuration, may allow for improved device lifetime with minimal or limited increase in cost and manufacturing complexity. In some cases this may allow for an increase in the lifetime of the device by up to a factor of three, as well as reducing the power consumption of a display by up to approximately 15%. The architectures disclosed herein also may provide improved display lifetime but without a significant increase in product cost. For example, various arrangements disclosed herein may be implemented with not more than about a 50% increase in Total Average Cycle Time (TACT) over conventional displays, or not more than about a 50% increase in capital cost of an OLED deposition system. Implementations of the techniques disclosed herein also may require no change or minimal change of the OLED backplane relative to a conventional backplane. For example, some implementations may combine pixel anode column connections to two external connections instead of one, while leaving other architecture details unchanged relative to conventional fabrication techniques and arrangements. As another example, multiple power supplies or power supply voltages may be used instead of the single source, single-voltage power supply common to conventional display devices, to allow different voltages to be provided to sub-pixels having different stack sizes.

More generally, embodiments of the invention may use sub-pixels having various numbers of emissive layers. That is, sub-pixels of a first color may have m emissive layers, and sub-pixels of a second, different color, may have n emissive layers, where n>m. Sub-pixels of a third color may have m or n emissive layers, or may have a number of emissive layers p different from both m and n. As used herein, a sub-pixel is considered to be a specific color when it has a peak emission wavelength of that color, or within a range associated with the color. As used herein, each sub-pixel in a pixel may be independently addressable, i.e., it may be individually controlled by selectively applying current to the sub-pixel.

In general, embodiments of the invention may provide an organic light emitting device having multiple sub-pixels. Each sub-pixel may include an anode, a cathode, and one or more organic emissive layers disposed between the anode and the cathode. Devices having multiple organic emissive layers may include internal electrodes or similar layers, such as where an electrode is disposed between an anode and a cathode, and an organic emissive layer is disposed between each pair of the anode and the internal electrode, and the internal electrode and the cathode. The organic emissive layer may include a host and a dopant such as a phosphorescent dopant as disclosed herein.

Figure 15:
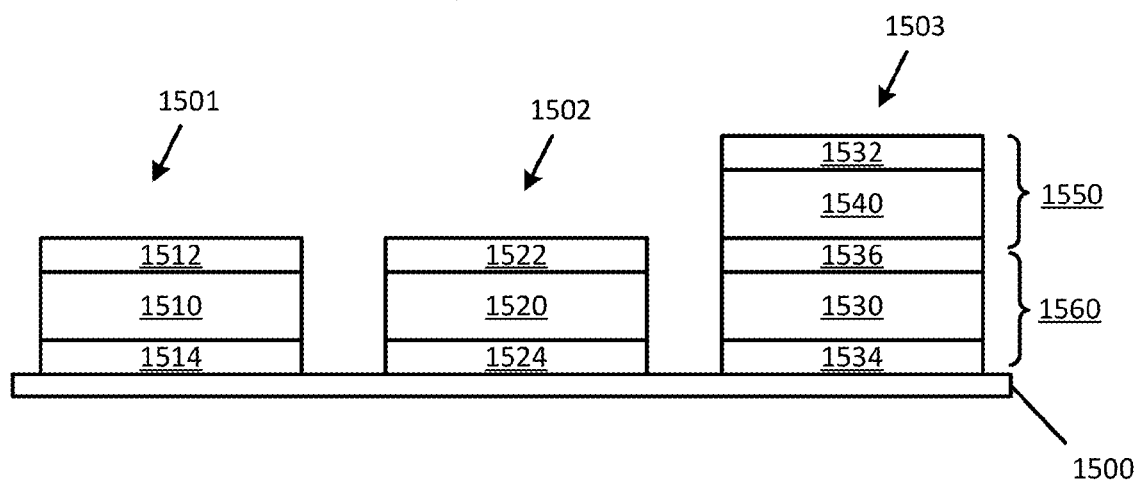
FIG. 15 shows example sub-pixels according to an embodiment of the invention including a sub-pixel with multiple emissive layers.

FIG. 15 shows example sub-pixel devices according to an embodiment of the invention. For clarity, only three sub-pixels 1501, 1502, 1503 are shown, though it will be understood that a device as disclosed herein may include any number of sub-pixels that may be addressed in various ways to form multiple pixels, such as within a full-color display or similar device. The devices are disposed on a substrate 1500, over which each of the layers shown may be deposited in order, as previously described herein. Each sub-pixel includes a first electrode 1514, 1524, 1534 disposed over the substrate and a second electrode 1512, 1522, 1532 disposed over the first electrode. Emissive regions 1510, 1520, and 1530 may be disposed over the respective first electrode. Sub-pixels such as those shown in FIGS. 15 and 16 may be described herein as containing one or more emissive layers and the emissive regions 1510, 1520, 1530, and so on may be referred to as emissive layers, though it will be understood that more generally these regions may include other layers as described. More specifically, the emissive regions may include an emissive layer as well as other layers disclosed herein, such as transport layers, blocking layers, and the like. Each emissive layer may be characterized by an emission spectrum with a peak wavelength, which may be selected to provide a desired color of visible light when a current is applied. The selection of specific materials, including dopants such as phosphorescent dopants, to obtain a desired emission color will be well understood by one of skill in the art.

Sub-pixel 1503 shows an example of multiple emissive layers 1530, 1540 in a sub-pixel. An internal electrode 1536 or other interface may be disposed between the emissive layers 1530, 1540. As previously described, other layers may be disposed between each pair of electrodes 1532 and 1536, and 1536 and 1534. The sub-pixel 1503 may be referred to as a "stacked" device, the operation of which will be readily understood by one of skill in the art. Each sub-pixel 1501, 1502, 1503 may emit a different color of light. For example, the sub-pixels may emit red, green, and blue light respectively. The stacked device 1503 may be configured to emit any desired color of light. Typically the stacked device 1503 is configured to emit light that otherwise would be the limiting factor in the lifetime of a device in which the sub-pixels 1501, 1502, 1503 are incorporated. For example, where a single emissive layer blue device would otherwise have the shortest lifetime compared to the sub-pixels 1501, 1502, it is preferably to configure the stacked device 1503 to emit blue light.

More generally, each sub-pixel in a multi-pixel arrangement in which sub-pixels emit different colors of light may be configured with any desired number of emissive layers, to obtain desired lifetimes of the sub-pixels and, therefore, the device as a whole. For example, in some configurations it may be found that blue devices have the lowest average lifetime, red devices the next lowest, and green devices the highest lifetime. Accordingly, blue and red sub-pixels may be configured to use multiple emissive layers, and green sub-pixels to use single emissive layers. In some cases, the number of emissive layers may be selected based upon the relative resulting lifetimes and/or power requirements. Continuing the previous example, blue sub-pixels may be configured with three or more emissive layers, red sub-pixels with two or more emissive layers, and green sub-pixels with one or more emissive layers.

In an embodiment, a light-emitting region of a device may include one or more pixels. Each pixel may include a first sub-pixel, such as sub-pixel 1501, having a first emissive layer having a first peak emission wavelength, such as emissive layers 1510, 1520. The pixel also may include a second sub-pixel, such as sub-pixel 1502, having a second emissive layer with a second peak emission wavelength different from the first peak emission wavelength, such as emissive layer 1530, and a third emissive layer with a third peak emission wavelength different from the first peak emission wavelength, such as emissive layer 1540. The third emissive layer may be disposed over the second emissive layer to form a stacked device as previously described. It may be preferred for the first emissive layer to be a red or green emissive layer, and for the second and third emissive layers to be blue emissive layers. The pixel may include additional sub-pixels. For example, the pixel may include a third sub-pixel such as sub-pixel 1502. The third sub-pixel may have a fourth emissive layer, such as emissive layer 1520, with a fourth peak emission wavelength different from each of the first, second, and third peak emission wavelengths. Where the first emissive layer is a red or green emissive layer, it may be preferred for the fourth emissive layer to be green or red, respectively.

The second sub-pixel may include additional emissive layers, such as where a fourth emissive layer with a fourth peak emission wavelength different from the first peak emission wavelength is disposed over the third emissive layer. The additional layers may be the same color or substantially the same color as the second emissive layer. For example, the fourth peak emission wavelength may be equal to, substantially equal to, or within a threshold range of the first peak emission wavelength. As a specific example, the fourth peak emission wavelength may be within 10%, more preferably 5%, of the second peak emission wavelength. Thus, the color emitted by each emissive layer in a stacked sub-pixel may be visibly the same or substantially the same color.

Figure 16:
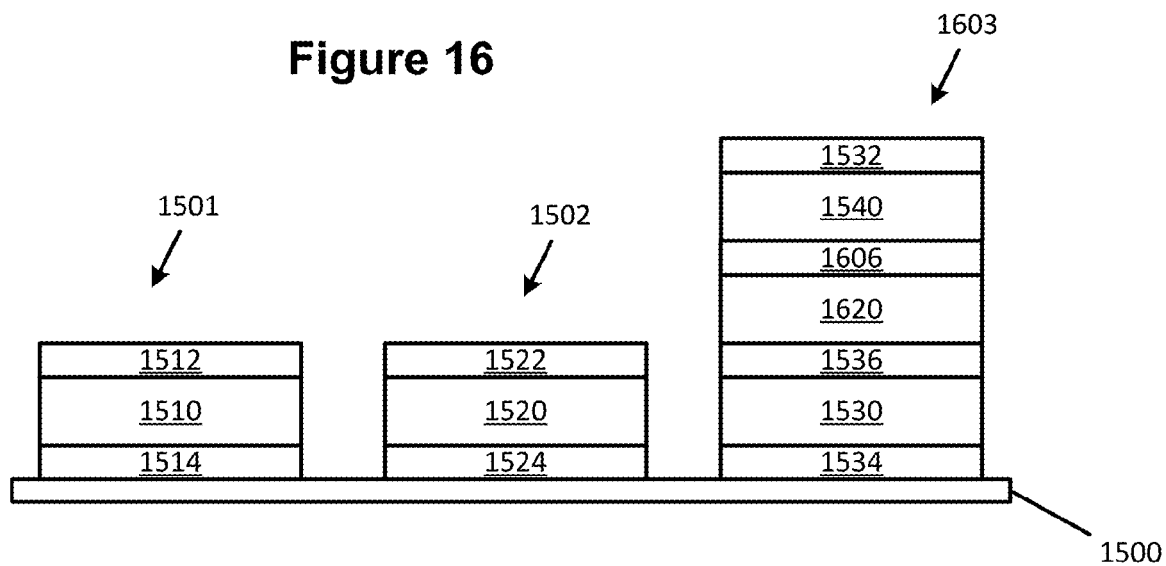
FIG. 16 shows example sub-pixels according to an embodiment of the invention including a sub-pixel with multiple emissive layers.

FIG. 16 shows example sub-pixel devices according to an embodiment of the invention, in which one sub-pixel includes three emissive layers 1530, 1540, 1620. The structure of each sub-pixel 1501, 1502, 1603 is similar to the structure shown and described with respect to FIG. 15. In contrast to FIG. 15, sub-pixel 1603 includes an additional internal electrode or similar layer 1606 and an additional emissive layer 1620. Thus, similar to the stacked device 1503 of FIG. 15, the stacked device 1603 includes multiple emissive layers, which may provide improved lifetime relative to a single emissive layer device.

Displays and other devices may include multiple groups of sub-pixels as shown in FIGS. 15 and 16, which may be logically addressed as individual pixels as disclosed herein and as will be readily understood by one of skill in the art. The specific arrangements and groupings of sub-pixels shown in FIGS. 15 and 16 are illustrative only, and various other arrangements may be used. In some configurations, physical sub-pixels may be shared between two or more logical pixels, such as where a larger red, green, or blue sub-pixel is grouped with two sets of sub-pixels of the other two colors, to form two separately-addressable logical pixels. Other arrangements may be used, such as those disclosed in U.S. Patent Application Pub. No. 2011/0127506, the disclosure of which is incorporated by reference in its entirety, and as will be readily understood by one of skill in the art.

The individual emissive regions within a stacked device also may be referred to as devices or sub-devices. For example, referring to FIG. 15, each emissive layer 1530, 1540 may be considered to be an emissive layer within a sub-device 1550, 1560, respectively. Each sub-device may be defined by a first and second electrode or similar layer, such as layers 1532, 1536 which define sub-device 1550. Similarly, layers 1534, 1536 may be considered as the boundaries of the sub-device 1560.

To fabricate a partially-stacked device as disclosed herein, any initial common layers may be deposited, followed by various combinations of emissive layers and/or additional common layers. For example, after depositing one or more layers common to each sub-pixel, such as the layers below the emissive layer in FIGS. 1-2, a first emissive layer may be deposited for a first type of sub-pixel, such as a red or green sub-pixel. A second type of emissive layer may be deposited after the first type. The first and second types of sub-pixels may be deposited using, for example, masking processes or other patterning process such as LITI, OVJP, or the like. A third type of emissive layer, such as for blue sub-pixels, may then be deposited locally over the appropriate sub-pixel regions, for example over anode pads designated for the blue sub-pixels. A stacked device may be built by depositing additional layers, including additional emissive layers, over the desired sub-pixels. For example, where a masking technique is used, the mask may be left in in place so as to deposit an emissive layer and any adjacent layers such as an ETL, followed by an internal electrode or similar layer, upper HIL and/or HTL, and a second EML. The mask may then be removed, and any additional common layers, such as blocking, ETL, and/or cathode layers, may be deposited. Similarly, where other patterning techniques are used, additional layers of electrodes, emissive layers, transport layers, and the like may be deposited over an initial emissive layer to form a stacked region having multiple emissive layers. The approach may be repeated to produce devices having two, three, or more emissive layers.

In some implementations, two common power supplies may be used. For example, if a blue sub-pixel uses a stacked device and associated red and green sub-pixels use single emissive layer devices, then two common power supplies may be used. In such a configuration, a common cathode connection can be used for all three sub-pixels, and a separate anode supply provided for the blue sub-pixel relative to the red and green pixels. Thus, two common anode power supplies may be used per display. In general the anode power may be supplied to each sub-pixel through power lines running through each column of the display, and/or through sub-pixels of the same color. Similar configurations may be used for displays that do not use standard column arrangements for the sub-pixels as will readily be understood by one of skill in the art. The particular voltages to be applied to different sub-pixels, and the arrangement of power supplies, may be selected based upon whether each sub-pixel is stacked and/or the number of emissive regions or sub-devices in the sub-pixel.

Figure 17:
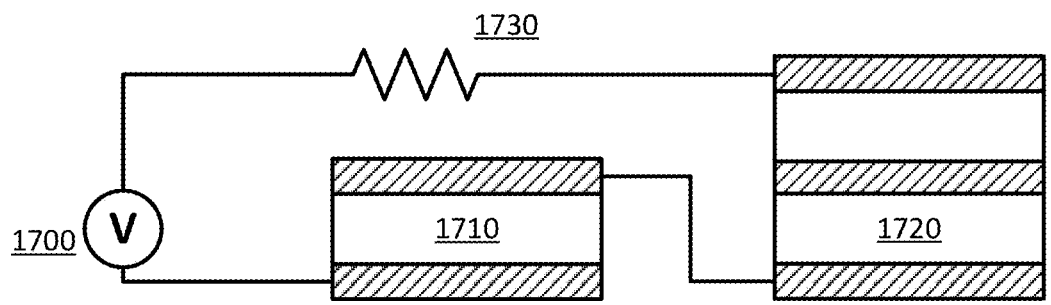
FIG. 17 shows an example simplified schematic according to an embodiment of the invention, in which a single voltage source is used to provide a power supply to two sub-pixels.

FIG. 17 shows an example simplified schematic according to an embodiment of the invention, in which a single voltage source is used to provide a power supply to two sub-pixels 1710, 1720. One sub-pixel 1710 is a single emissive layer device; the other sub-pixel 1720 is a stacked device as previously described, which includes two emissive layers. The voltage source 1700 may provide power to both sub-pixels, by using connecting circuitry 1730 that adjusts the voltage applied to each of the sub-pixels 1710, 1720.

Figure 18:
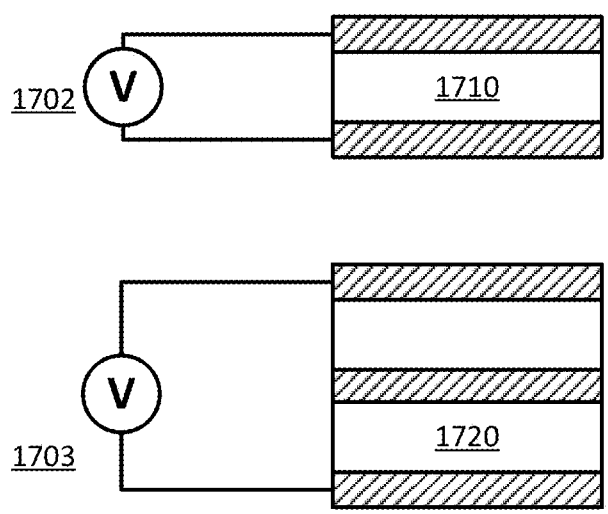
FIG. 18 shows an example simplified schematic according to an embodiment of the invention in which separate power supplies provide power to associated separate sub-pixels.

Alternatively, separate voltage sources may be used for each sub-pixel or each type of sub-pixel, for example depending upon whether each sub-pixel is a single emissive layer device or a stacked device. FIG. 18 shows an example simplified schematic according to an embodiment of the invention in which two separate power supplies 502, 503, provide power to sub-pixels 1710, 1720, respectively.

More generally, a device according to an embodiment of the invention may include first and second power sources that provide first and second voltages to first and second sub-pixels within the device, respectively. The power sources may be provided as separate and distinct power supplies, such as power supplies 1702, 1703 in FIG. 18. Alternatively, the power sources may be provided by a single power supply 1700 as shown in FIG. 17, in conjunction with appropriate connecting circuitry 1730. The use of multiple power supplies may allow for improved power consumption over arrangements using a single power supply applied to both single emissive layer sub-pixels and stacked sub-pixels. Generally, it may be desirable to provide a higher voltage to a stacked device to obtain the same luminance from the emissive portion of the sub-pixel as would be expected in a single emissive layer device. However, if the higher voltage was also applied to the single emissive layer sub-pixel, it likely would increase the power consumption of the system. The use of a separate power supply for the single emissive layer sub-pixel or sub-pixels thus allows for optimization of the power consumption of the overall system. If a single power supply was used to power all sub-pixels regardless of configuration, excess power likely would be lost as heat within the system, which could negatively and undesirably affect the lifetime and/or power consumption of the system. The specific circuitry that may be used in a particular configuration of sub-pixels will be readily apparent to one of skill in the art.

It will be understood that the diagrams shown in FIGS. 17 and 18 are greatly simplified for ease of illustration, and that in general any suitable voltage source arrangement and associated circuitry may be used.

Sub-pixels may be disposed in various configurations as previously described. For example, the third sub-pixel may be disposed adjacent to one or both of the first and second sub-pixels. Multiple sub-pixels may be arranged in columns, staggered rows, or other configurations. In an embodiment, the sub-pixels may have shared or common layers, such as where two or more emissive layers in different sub-pixels are disposed over a single electrode layer, blocking layer, or other layer. A shared layer may be common between the single emissive layer sub-pixels but not common with stacked sub-pixels, or it may be common among a stacked sub-pixel and one or more single emissive layer sub-pixels.

EXPERIMENTAL

Simulations on an exemplary device comprising were performed of different capping layers for each of several different color OLEDs. The exemplary device had the following characteristics: The display size was 4-inches (diagonal length) and all parameters were calculated for a total display brightness of 300 cd/m2 for a white point with 40% of the pixels turned on. The thin film transistors (TFT) had a voltage of 5.5V and the OLEDs each had a voltage of 4V. The lighting panel also had a circular polarizer applied which attenuated the total panel transmission to 44%. The 1931 CIE coordinates for each of the OLED colors is as follows: red (0.67, 0.32); green (0.21, 0.71); and blue (0.13, 0.058). The combined white emission of the device had a CIE coordinate of (0.29, 0.30).

Table 1 below shows the results of the simulations for power consumption for the exemplary 4-inch display described above, where the display has (1) the red, green, and blue pixels optimized separately with different capping layer optical thicknesses and (2) where the capping layer is optimized for the blue pixels only, but is common to red, green and blue pixels: The capping layer optically coupled to the red OLED comprised 100 nm of $Alq_3$ and had an optical thickness of 170 nm. The capping layer optically coupled to the green OLED comprised 80 nm of Alq3 and had an optical thickness of 138 nm. The capping layer optically coupled to the blue OLED comprised 70 nm of $Alq_3$ and had an optical thickness of 125 nm.

TABLE 1

Simulation Results of Exemplary Device

| | Red Light Emission luminous efficacy [cd/A] | Green Light Emission luminous efficacy [cd/A] | Blue Light Emission luminous efficacy [cd/A] | Power Consumption of Display [W] |
| --- | --- | --- | --- | --- |
| (1) RGB optimized capping layer | 46 | 116 | 7.8 | 0.300 |
| (2) B only optimized capping layer | 32 | 104 | 7.8 | 0.343 |

As can be seen in Table 1, the light emission for this exemplary embodiment substantially increases for the red OLEDs (approximately 43.75% increase in luminance) and the green OLEDs (approximately 11.54% increase in luminance) when the capping layer that is optically coupled to each is optimized. The light emission from the blue OLEDs, as expected, remained the same as the capping layer optically coupled to these devices had the same optical thickness in both simulations. As a result of the optimization for each capping layer, the power consumption of the display decreased by 0.043 W (approximately 14.33%) as compared to the device having only a single optimized capping layer. Thus, the simulation confirms that devices that comprise capping layers that are optimized for each of the OLED colors have higher emission levels and thereby lower power consumption. The reduced power consumption and resulting increase in efficiencies may also lead to longer lifetimes of the devices. For example, using a typical red phosphorescent OLED acceleration factor of two, the lifetime of the red pixel in case 1 (i.e. when the red OLED is optimized) can be expected to be 2.1 times longer than the device in case 2 (i.e. not optimized) for the same initial luminance.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:
1. A device comprising:
a plurality of OLEDs;
a first capping layer disposed over a first portion of the plurality of OLEDs, including a first OLED, and coupled to the first portion of the plurality of OLEDs, and a second capping layer disposed over a second portion of the plurality of OLEDs and optically coupled to the second portion of the plurality of OLEDs, but not optically coupled to the first plurality of OLEDs;

wherein:

the first OLED of the plurality of OLEDs is a blue OLED that has a first peak emission wavelength, and comprises a first transport layer, and a second OLED of the plurality of OLEDs has a second peak emission wavelength different from the first peak emission wavelength and comprises a second transport layer, wherein the first transport layer is a non-common layer among the first and second OLEDs, and the second transport layer is a non-common layer among the first and second OLEDs:

the blue OLED comprises a plurality of emissive layers, at least a first of the plurality of emissive layers comprising a first host material, a second host material, and an emissive material, wherein the HOMO of the second host material is between the HOMO of the first host material and the HOMO of the emissive material and the LUMO of the second host material is between the LUMO of the first host material and the LUMO of the emissive material;

the blue OLED comprises a transport layer disposed adjacent to the first emissive layer, wherein the transport layer comprises a material having a first triplet state having a higher energy level than a first triplet state of the emissive material; and at least one of the plurality of OLEDs comprises an OLED of a different color than the blue OLED and comprises a single emissive layer.

2. A device as recited in claim 1, wherein the device comprises an organic light emitting display capable of being driven at about 500 cd/m$^2$ with a luminance decay of not more than about 3% after 20,000 hours of operation.

3. A device as recited in claim 1, wherein the device comprises a plurality of individually-addressable sub-pixels, at least one of said sub-pixels comprising a phosphorescent emissive material.

4. A display as recited in claim 3, wherein at least a second sub-pixel comprises a phosphorescent emissive material.

5. A device as recited in claim 3, wherein the phosphorescent emissive material emits light having a peak wavelength in the range of 400-500 nm.

6. A device as recited in claim 1, wherein:

a third OLED of the plurality of OLEDs has a red peak emission wavelength, a fourth OLED of the plurality OLEDs has a green peak emission wavelength, and a fifth OLED of the plurality of OLEDs has a light blue peak emission wavelength or a deep blue peak emission wavelength, and wherein the difference in peak wavelengths emitted by the fifth OLED and the first OLED is at least 4 mn.

7. A device as recited in claim 6, wherein each of the first OLED, the third OLED, the fourth OLED, and the fifth OLED has substantially the same surface area.

8. A device as recited in claim 6, wherein the first OLED has a larger surface area than each of the third OLED and the fourth OLED.

9. A device as recited in claim 1, wherein the plurality of OLEDs further comprises a third portion of OLEDs different from the first and second portions, said device further comprising a third capping layer disposed over the third portion of the plurality of OLEDs and optically coupled to at least the third plurality of OLEDs.

10. A device as recited in claim 9, wherein the third portion of the plurality of OLEDs comprises a plurality of red OLEDs, a plurality of blue OLEDs, and a plurality of green OLEDs, wherein the second capping layer is not optically coupled to the plurality of blue OLEDs or to the plurality of green OLEDs, and wherein the third capping layer is not optically coupled to the plurality of red OLEDs or to the plurality of blue OLEDs.

11. A device as recited in claim 9, wherein the third capping layer is not optically coupled to the first portion of the plurality of OLEDs.

12. A device as recited in claim 9, wherein the third capping layer is not optically coupled to the second portion of the plurality of OLEDs.

13. A device as recited in claim 1, wherein:

the first capping layer has a total optical path that is constant over the first portion of the plurality of OLEDs;

the second capping layer has a total optical path that is constant over the second portion of the plurality of OLEDs; and the first total optical path is different from the second total optical path.

14. A device as recited in claim 1, wherein the HOMO of the first host material is within about 0.2-0.4 eV of the HOMO of the emissive material.

15. A device as recited in claim 1, wherein the LUMO of the second host material is within about 0.2-0.4 eV of the LUMO of the emissive material.

16. A device as recited in claim 1, wherein the HOMO of the first host material is within about 0.2-0.4 eV of the HOMO of the emissive material.

17. A device as recited in claim 1, wherein the LUMO of the second host material is within about 0.2-0.4 eV of the LUMO of the emissive material.

18. A device as recited in claim 1, wherein the emissive material has a peak emission wavelength in the range 470-500 nm.

19. A device as recited in claim 1, wherein the emissive material has a peak emission wavelength in the range 400-470 nm.

20. A device as recited in claim 1, wherein the first host material has a first triplet state having a higher energy level than a first triplet state of the emissive material.

21. A device as recited in claim 20, wherein the HOMO of the first host material is less than the HOMO of the emissive material.

22. A device as recited in claim 1, wherein the second host material has a first triplet state having a higher energy level than a first triplet state of the emissive material.

23. A device as recited in claim 22, wherein the LUMO of the second host material is greater than the LUMO of the emissive material.

24. A device as recited in claim 1, wherein the first triple state of the material in the first transport layer is at least 2.6 eV.

25. A device as recited in claim 1, wherein the first triplet state of the material in the first transport layer is at least 2.8 eV.

26. A device as recited in claim 1, wherein the second OLED of the plurality of OLEDs comprises a red OLED having a red peak emission wavelength, the red OLED comprising a single emissive layer.

27. A device as recited in claim 26, wherein the red OLED and the blue OLED share at least one common layer.

28. A device as recited in claim 1, wherein the second OLED comprises a green OLED having a green peak emission wavelength, the green OLED comprising a single emissive layer.

29. A device as recited in claim 28, wherein the green OLED and the blue OLED share at least one common layer.

* * * * *